(12) United States Patent
Katayama et al.

(10) Patent No.: US 8,508,976 B2
(45) Date of Patent: Aug. 13, 2013

(54) NONVOLATILE MEMORY ELEMENT AND NONVOLATILE MEMORY DEVICE

(75) Inventors: Koji Katayama, Nara (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 354 days.

(21) Appl. No.: 12/994,910

(22) PCT Filed: Apr. 23, 2010

(86) PCT No.: PCT/JP2010/002943
§ 371 (c)(1),
(2), (4) Date: Nov. 29, 2010

(87) PCT Pub. No.: WO2010/125780
PCT Pub. Date: Nov. 4, 2010

(65) Prior Publication Data
US 2011/0103131 A1    May 5, 2011

(30) Foreign Application Priority Data

Apr. 30, 2009    (JP) ................. 2009-111517

(51) Int. Cl.
*G11C 11/00*    (2006.01)
*H01L 45/00*    (2006.01)
(52) U.S. Cl.
USPC ............... 365/148; 257/2; 257/E45.001
(58) Field of Classification Search
USPC .............. 365/148; 257/2, E45.001
See application file for complete search history.

(56) References Cited

U.S. PATENT DOCUMENTS

| 7,920,408 | B2 | 4/2011 | Azuma et al. |
| 8,058,636 | B2 | 11/2011 | Osano et al. |
| 8,217,489 | B2 | 7/2012 | Osano et al. |
| 2003/0223268 | A1 | 12/2003 | Tanizaki et al. |

(Continued)

FOREIGN PATENT DOCUMENTS

| JP | 2004-005797 | 1/2004 |
| JP | 2005-025914 | 1/2005 |

(Continued)

OTHER PUBLICATIONS

International Search Report issued Jul. 20, 2010 in International (PCT) Application No. PCT/JP2010/002943.

(Continued)

*Primary Examiner* — Huan Hoang
*Assistant Examiner* — Tri Hoang
(74) *Attorney, Agent, or Firm* — Wenderoth, Lind & Ponack, L.L.P.

(57) ABSTRACT

Provided is a nonvolatile memory element which has a small variation in operation and allow stable operation. The nonvolatile memory element includes: a first electrode (102); a second electrode (106); a variable resistance layer (105) which is formed between the electrodes (102 and 106) and is connected to the electrodes (102 and 106), and which reversibly changes between a high resistance state and a low resistance state according to a polarity of a voltage applied between the electrodes (102 and 106); and a fixed resistance layer (104) which has a resistance value that is 0.1 and 10 times as large as a resistance value of the variable resistance layer in the high resistance state, the fixed resistance layer (104) being formed between the electrodes (102 and 106) and being electrically connected to at least a part of the variable resistance layer (105).

20 Claims, 28 Drawing Sheets

(56) References Cited

U.S. PATENT DOCUMENTS

| | | |
|---|---|---|
| 2004/0264244 A1 | 12/2004 | Morimoto |
| 2005/0230724 A1 | 10/2005 | Hsu |
| 2006/0077706 A1 | 4/2006 | Li et al. |
| 2006/0077741 A1 | 4/2006 | Wang et al. |
| 2006/0198224 A1* | 9/2006 | Ueda et al. .............. 365/209 |
| 2007/0249083 A1 | 10/2007 | Li et al. |
| 2009/0052225 A1 | 2/2009 | Morimoto |
| 2009/0102598 A1* | 4/2009 | Yamazaki et al. ........... 338/20 |
| 2009/0250678 A1* | 10/2009 | Osano et al. ................ 257/2 |
| 2009/0323397 A1 | 12/2009 | Kinoshita |
| 2010/0046270 A1 | 2/2010 | Katoh et al. |
| 2010/0046273 A1 | 2/2010 | Azuma et al. |
| 2010/0078615 A1 | 4/2010 | Ito |
| 2012/0074369 A1 | 3/2012 | Osano et al. |
| 2012/0235111 A1 | 9/2012 | Osano et al. |

FOREIGN PATENT DOCUMENTS

| | | |
|---|---|---|
| JP | 2005-311322 | 11/2005 |
| JP | 2006-108645 | 4/2006 |
| JP | 2006-203098 | 8/2006 |
| JP | 2006-310913 | 11/2006 |
| JP | 2007-184065 | 7/2007 |
| WO | 2008/059946 | 5/2008 |
| WO | 2008/102718 | 8/2008 |
| WO | 2008/126166 | 10/2008 |
| WO | 2008/126365 | 10/2008 |
| WO | 2009/001534 | 12/2008 |

OTHER PUBLICATIONS

I. G. Beak et al., "Multi-layer Cross-point Binary Oxide Resistive Memory (OxRRAM) for Post-NAND Storage Application", IEDM2005, Dec. 5, 2005.

* cited by examiner (a)

(b)

(a)

(b)

(c)

(d)

(a)

(b)

(c)

(d)

(a)

(b)

(c)

(d)

(a)

(b)

(c)

(d)

NONVOLATILE MEMORY ELEMENT AND NONVOLATILE MEMORY DEVICE

TECHNICAL FIELD

The present invention relates to a nonvolatile memory element whose resistance value reversibly changes based on an electrical signal, and a nonvolatile memory device including the nonvolatile memory element.

BACKGROUND ART

Recent years have seen progress in research and development of nonvolatile memory devices having memory cells each including a so-called variable resistance nonvolatile memory element (hereinafter, also simply referred to as a variable resistance element). Here, the variable resistance nonvolatile memory element refers to an element which has a characteristic of changing its resistance value according to an electrical signal and which can further store data corresponding to the resistance value in a nonvolatile manner. More specifically, the variable resistance nonvolatile memory element is a nonvolatile memory element whose resistance state reversibly changes between a high resistance state and a low resistance state according to a polarity of an applied voltage.

A nonvolatile memory device which is formed by arranging, in a matrix, so-called 1T1R (1 transistor 1 resistor) memory cells in each of which a MOS transistor and a variable resistance element are connected in series at a crosspoint between corresponding ones of bit lines and word lines that are placed orthogonally to each other is generally known as the nonvolatile memory device including such variable resistance elements (see Patent Literature 1, for instance).

Patent Literature 1 discloses a nonvolatile memory device including 1T1R memory cells in each of which a variable resistance element is made of an oxide having a perovskite crystalline structure.

Furthermore, in addition to a 1T1R (1 transistor 1 resistor) memory cell array, a memory cell array having a so-called crosspoint structure is generally known. In the crosspoint structure, each of the memory cells is provided at a crosspoint between corresponding ones of bit lines and word lines that are placed orthogonally to each other, so as to be placed between the corresponding ones of the bit lines and the word lines.

Patent Literature 3 discloses a nonvolatile memory device in which bidirectional variable resistance elements are used as memory cells. Patent Literature 3 discloses that a varistor, for example, is used as a bidirectional nonlinear element for a diode of a memory cell, so as to reduce a so-called leakage current flowing in a non-selected cell. Patent Literature 3 also discloses the crosspoint structure.

Patent Literature 2 discloses a nonvolatile memory device having a memory cell array including variable resistance elements having a multilayer structure and a three-dimensional crosspoint structure.

Non Patent Literature 1 discloses a memory cell structure in which a variable resistance element layer and a unidirectional diode are combined. Non Patent Literature 1 also discloses the multilayer structure.

In the meantime, there is a problem that when an excessive voltage is applied to or an excessive current is passed through a nonvolatile memory element having a variable resistance element layer, a resistance value of the nonvolatile memory element changes so significantly that the nonvolatile memory element does not show a resistance change.

In view of such a problem, it is intended to achieve a more stable operation by limiting the voltage or the current (see Patent Literature 4, for example). Patent Literature 4 discloses that a parallel resistance circuit or a series resistance circuit is provided to the outside of a memory cell, so as to prevent an excessive voltage from being applied to and an excessive current from being passed through the memory cell.

CITATION LIST

Patent Literature

[PTL 1] Japanese Unexamined Patent Application Publication No. 2005-25914 (FIG. 2)
[PTL 2] Japanese Unexamined Patent Application Publication No. 2006-203098 (FIGS. 2 and 5)
[PTL 3] Japanese Unexamined Patent Application Publication No. 2005-311322 (FIG. 4)
[PTL 4] International Publication WO 2008/059946 (FIGS. 1 and 5)

Non Patent Literature

[NPL 1] I. G. Baek, et al., "Multi-layer Cross-point Binary Oxide Resistive Memory (OxRRAM) for Post-NAND Storage Application", IEDM 2005 (IEEE international ELECTRON DEVICES meeting 2005), 769-772, Session 31 (FIG. 7, FIG. 11), Dec. 5, 2005

SUMMARY OF INVENTION

Technical Problem

However, in the above conventional techniques, there is a problem that wiring resistance of bit lines and word lines causes voltage division among wires and nonvolatile memory elements. Because each of nonvolatile memory elements has a different wiring length, even when the same voltage pulse is applied to a word line, voltages each applied to a corresponding one of the nonvolatile memory elements connected to the word line differ from each other. Consequently, resistance values in a high resistance state and a low resistance state vary in each nonvolatile memory element, and further when a memory cell array is enlarged and wires are extended, a change in transient voltage or current caused by parasitic capacitance between the wires cannot be ignored. In other words, a transient voltage or current caused by the wiring resistance and the parasitic capacitance is greater in a memory cell having a long wiring distance than in a memory cell having a short wiring distance. As a result, even if a limiting circuit is provided to the outside of the memory cell array, a case is highly likely to occur where it is impossible to accurately perform data writing and reading.

In view of the above problem, the present invention has an object to provide a nonvolatile memory element and a nonvolatile memory device which have a small variation in operation and allow stable operation.

Solution to Problem

In order to achieve the above object, a nonvolatile memory element according to an aspect of the present invention is a nonvolatile memory element which includes: a first electrode; a second electrode; a variable resistance layer which is formed between the first electrode and the second electrode and is connected to the first electrode and the second electrode, and which reversibly changes between a high resistance state and a low resistance state according to a polarity of a voltage applied between the first electrode and the second electrode; and a fixed resistance layer which is formed between the first electrode and the second electrode and is electrically connected in parallel to at least a part of the variable resistance layer. Furthermore, a resistance value of the fixed resistance layer is 0.1 to 10 times as large as a resistance value of the variable resistance layer in the high resistance state. It is to be noted that in terms of compatibility of suppressing the variation in resistance value and ensuring the window, the resistance value of the fixed resistance layer is preferably 0.5 to 2 times as large as the resistance value in the high resistance state of the variable resistance layer, and is further preferably in the same range as the resistance value in the high resistance state of the variable resistance layer.

With this structure, the fixed resistance layer is formed in the nonvolatile memory element itself, and thus it is possible to reduce the variation in resistance value of the whole element and prevent a transient current from causing resistance to increase excessively, which enables accurate data writing and reading.

Here, the variable resistance layer may have a stacked structure including at least a high resistance layer and a low resistance layer, and at least a part of the fixed resistance layer may be electrically connected in parallel to the high resistance layer.

Moreover, the high resistance layer may be connected to the first electrode, the low resistance layer may be connected to the second electrode, and the fixed resistance layer may be electrically connected to the first electrode.

Furthermore, the fixed resistance layer may be connected to the high resistance layer, and may be electrically connected to the first electrode and the second electrode.

Moreover, the nonvolatile memory element may further include an interlayer insulating layer which is formed to fill a space between the first electrode and the second electrode, and the variable resistance layer and the fixed resistance layer may be formed in an opening that is a through-hole formed in the interlayer insulating layer.

Here, the fixed resistance layer may be formed to completely cover around at least a part of an inner wall of the opening, and the variable resistance layer may be formed to fill a space which is inside of the opening and surrounded by the fixed resistance layer or, conversely, the variable resistance layer may be formed to completely cover the inner wall of the opening, and the fixed resistance layer may be formed to fill a space surrounded by the variable resistance layer.

It is to be noted that a plurality of openings including the opening may be formed in the interlayer insulating layer, the variable resistance layer may be formed to fill one of the openings, and the fixed resistance layer may be formed to fill an other one of the openings.

Furthermore, a nonvolatile memory device according to another aspect of the present invention is a nonvolatile memory device which stores data into a plurality of nonvolatile memory elements and which includes: a memory cell array in which a plurality of memory cells are two-dimensionally arranged, each of the memory cells including the nonvolatile memory element; a selection circuit which selects at least one memory cell from the memory cell array; a write circuit which causes the nonvolatile memory element in the selected memory cell to change to one of a high resistance state and a low resistance state; and a sense amplifier which determines whether the nonvolatile memory element in the selected memory cell is in the high resistance state or the low resistance state.

With this structure, the fixed resistance layer is formed in the nonvolatile memory element itself, and thus it is possible to reduce the variation in resistance value of the whole element and prevent a transient current from causing resistance to increase excessively, which enables accurate data writing and reading.

Here, the memory cell may be a circuit in which the nonvolatile memory element and a rectifying device may be connected in series or a circuit in which the nonvolatile memory element and a transistor may be connected in series.

Moreover, the memory cell array may be a multilayered memory cell array formed by stacking in layers a plurality of memory cells that are two-dimensionally arranged.

Advantageous Effects of Invention

The nonvolatile memory element according to the present invention includes a parallel resistance, and accordingly in the nonvolatile memory device including the memory cell array having such a nonvolatile memory element, each memory cell includes the parallel resistance. Thus, even when the transient current is generated in and out of the memory cell, the parallel resistance in the memory cell can limit the transient current flowing through the variable resistance layer of the nonvolatile memory element. As a result, it is possible to reduce the variation in operation between the memory cells, and to surely prevent malfunction.

DESCRIPTION OF EMBODIMENTS

Figure 1:
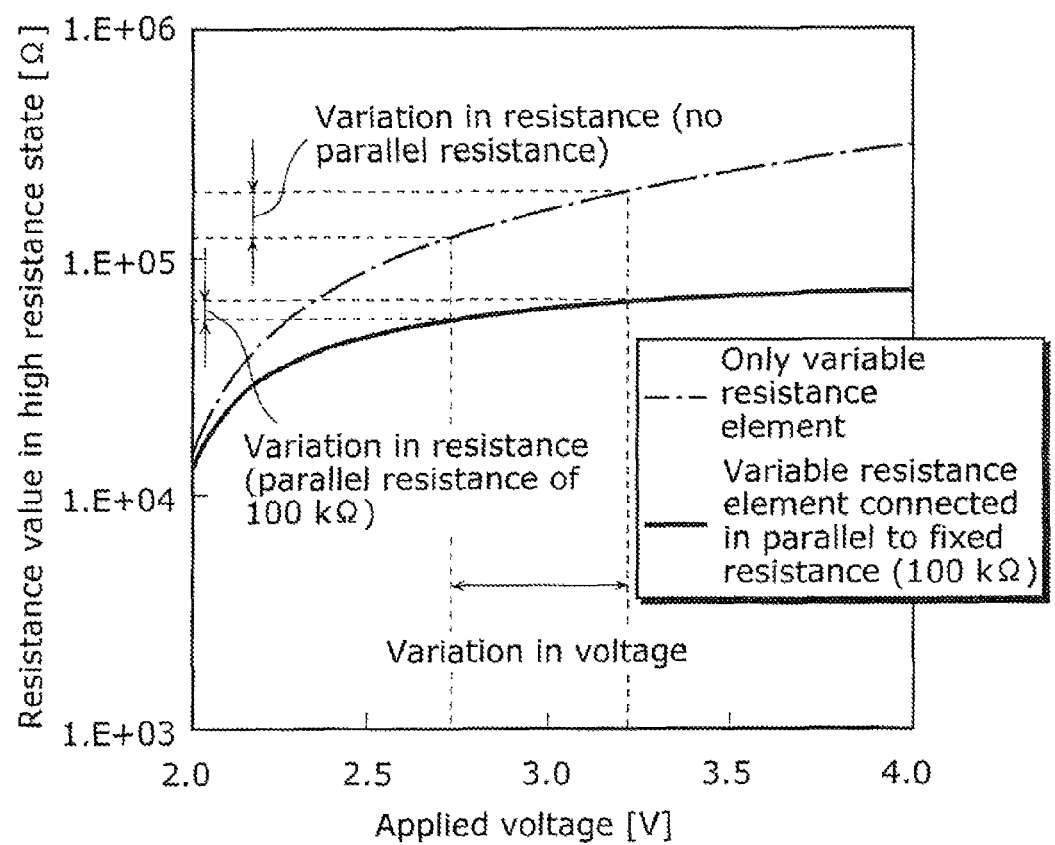
FIG. 1 is a diagram showing a relationship between a voltage for high resistance writing applied to a nonvolatile memory element in a low resistance state according to an embodiment of the present invention and a resistance value in a high resistance state after the voltage is applied.

The following describes a nonvolatile memory element and a nonvolatile memory device including the same according to embodiments of the present invention with reference to the drawings. It is to be noted that components having the same reference signs in the drawings indicate the same components, and description thereof may be omitted.

(Effect of Parallel Resistance)

First, before the specific embodiments of the present invention are described, a resistance value when a variable resistance element is connected in parallel to fixed resistance and an effect of reducing a variation in resistance value shall be described.

When fixed resistance having a resistance value $R_P$ is connected in parallel to a variable resistance element of which a resistance value in a high resistance state is an average value $R_h$ and has a variation $\Delta R_h$, an average value $R_{total}$ of overall resistance values and a variation in overall resistance values $\Delta R_{total}$ are expressed as below.

$$\frac{1}{R_{total}} = \frac{1}{R_p} + \frac{1}{R_h} \qquad \text{[Math. 1]}$$

$$\frac{1}{R_{total} + \Delta R_{total}} = \frac{1}{R_p} + \frac{1}{R_h + \Delta R_h}$$

$$\Delta R_{total} = \frac{R_{total}^2}{R_h^2} \cdot \Delta R_h = \frac{\Delta R_h}{(1 + R_h/R_p)^2} \qquad \text{[Math. 2]}$$

For instance, a case is considered where a resistance change occurs at about 10 kΩ and about 100 kΩ in a variable resistance element.

Here, assuming that a fixed resistance value is equal to the resistance value in the high resistance state $R_h$ ($R_p$=100 kΩ), $R_{total}$=50 kΩ, and the variation in overall resistance values $\Delta R_{total}$ is expressed as $\Delta R_{total}=\Delta R_h/4$.

It is clear that while the overall resistance values are halved, the variation is one-quarter of a variation of the variable resistance element itself.

FIG. 1 shows a case where there is no parallel resistance (an alternate long and short dashed line) and a case where parallel resistance is 100 kΩ (a solid line), regarding a resistance value in a high resistance state when a voltage for high resistance writing is applied to a nonvolatile memory element in a low resistance state.

In the same manner as a variation in applied voltage, it is clear that a variation in resistance can be reduced more in the case where the parallel resistance is 100 kΩ than in the case where there is no parallel resistance.

Figure 2:
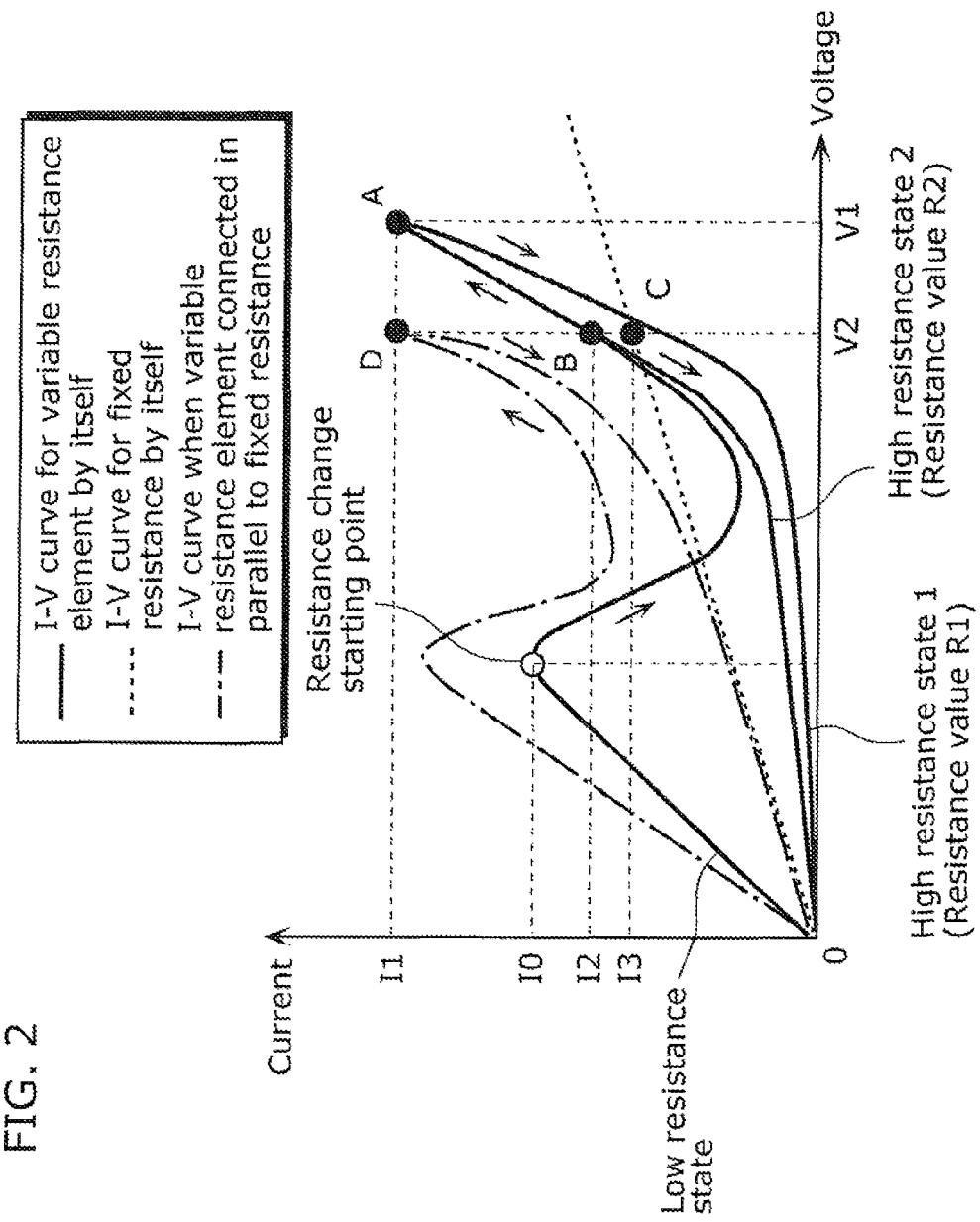
FIG. 2 is a diagram showing a relationship between a voltage for high resistance writing applied to the nonvolatile memory element in a low resistance state according to the embodiment of the present invention and a value of a current flowing in the nonvolatile memory element during the application of the voltage.

Furthermore, even when a large current flows transiently, the current is distributed to the parallel resistance and the variable resistance element, and thus it is possible to suppress the flow of the large current into the variable resistance element itself. FIG. 2 shows an I-V characteristic of the variable resistance element itself (a solid line), an I-V characteristic of fixed resistance itself (a broken line), and an I-V characteristic at the time when the variable resistance element is connected in parallel to the fixed resistance (an alternate long and short dashed line). Here, considering a case where a current I1 which is equal to or higher than a threshold current I0 for resistance change from a low resistance state to a high resistance state flows, when an element is only the variable resistance element itself, an operating point is point A, and a voltage V1 is applied to the element. As a result, a resistance state of the element changes from the low resistance state to a high resistance state 1 (a resistance value R1).

In contrast, when the variable resistance element is connected in parallel to the fixed resistance, an operating point at which the variable resistance element and the fixed resistance are coupled is point D and a current is divided. Thus, an operating point of the variable resistance element is point B (a voltage V2, a current I2) and an operating point of the fixed resistance is point C (a voltage V2, a current I3). As a result, a resistance state of the variable resistance element changes from the low resistance state to a high resistance state 2 (a resistance value R2). Here, the relationships are I1=I2+I3, V1>V2, and R1>R2, respectively. In other words, the resistance significantly increases (up to resistance value R1) if the large current I1 transiently flows when the nonvolatile memory element is the variable resistance element itself, whereas when the fixed resistance is connected in parallel, dividing the current into the fixed resistance and the variable resistance element makes it possible to prevent the resistance from increasing too much.

(Example Operations of Nonvolatile Memory Element)

Before specific operations of the nonvolatile memory element formed in the present embodiment are described, operation examples in the case of writing/reading data shall be described with reference to the drawings.

Figure 3:
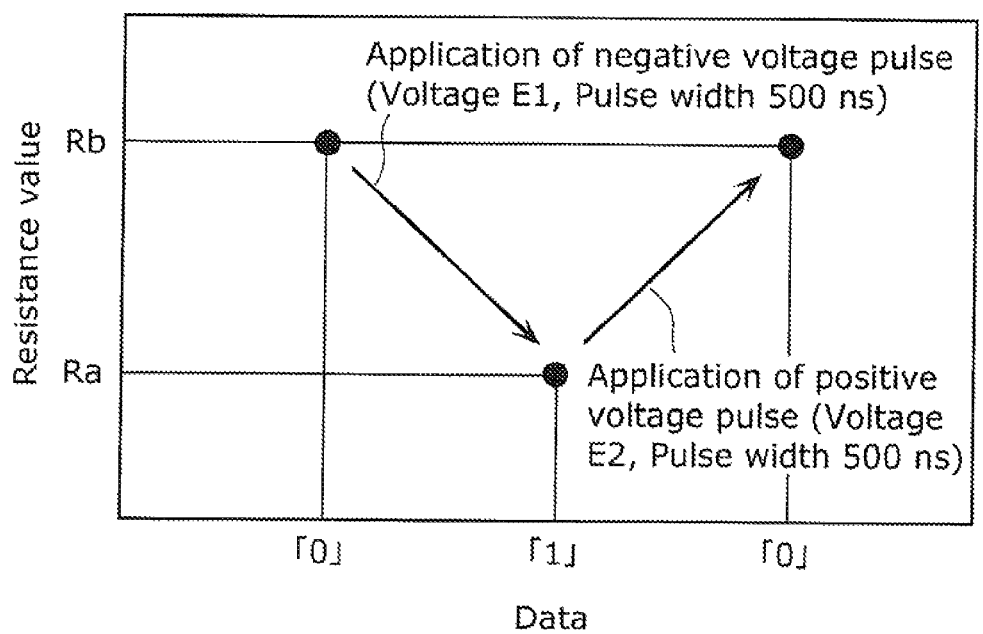
FIG. 3 is a diagram showing example operations of the nonvolatile memory element according to the embodiment of the present invention when data is written.

FIG. 3 is a diagram showing example operations of a nonvolatile memory element when data is written.

Alternately applying, between a first electrode and a second electrode of the nonvolatile memory element, two types of electrical pulses each having, for example, the pulse width of 500 ns and a different polarity changes a resistance value of the nonvolatile memory element as shown in FIG. 3. To put it differently, when a negative voltage pulse (voltage E1, pulse width 500 ns) is applied between the electrodes, the resistance value of the nonvolatile memory element is reduced from a high resistance value Rb to a low resistance value Ra. On the other hand, when a positive voltage pulse (voltage E2, pulse width 500 ns) is applied between the electrodes, the resistance value of the nonvolatile memory element is increased from the low resistance value Ra to the high resistance value Rb.

In the example shown in FIG. 3, the high resistance value Rb and the low resistance value Ra are assigned to data "0" and data "1", respectively. Thus, the data "0" is written by applying the positive voltage pulse between the electrodes so that the resistance value of nonvolatile memory element changes into the high resistance value Rb, and the data "1" is written by applying the negative voltage pulse between the electrodes so that the resistance value of nonvolatile memory element changes into the low resistance value Ra.

Figure 4:
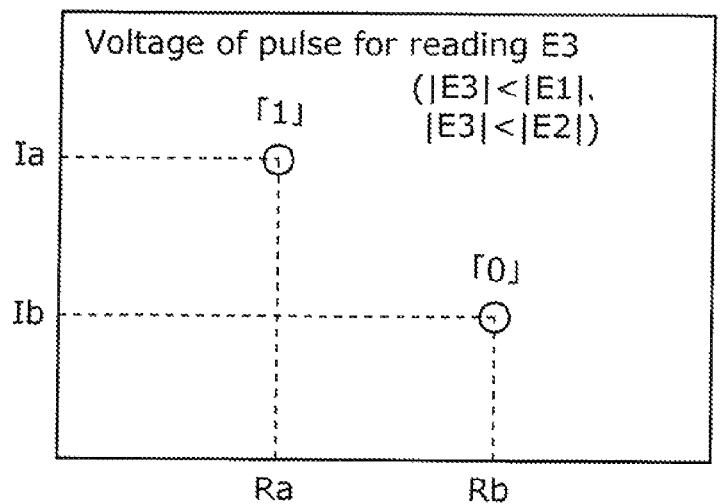
FIG. 4 is a diagram showing example operations of the nonvolatile memory element according to the embodiment of the present invention when data is read.

FIG. 4 is a diagram showing example operations of the nonvolatile memory element when data is read.

In the case of reading the data, a reading voltage E3 (|E3|<|E1|, |E3|) which has an amplitude smaller than that of an electric pulse applied to change the resistance value of the nonvolatile memory element is applied between the electrodes. As a result, a current corresponding to the resistance value of the nonvolatile memory element is provided, and detecting a value, of the provided current enables reading of written data (i.e., high resistance state or low resistance state).

In the example shown in FIG. 4, a value of a provided current Ia and a value of a provided current Ib correspond to the low resistance value Ra and the high resistance value Rb, respectively, and thus the data "1" is read when the value of the provided current Ia is detected and the data "0" is read when the value of the provided current Ib is detected.

(Resistance Change Characteristics when Parallel Resistance is Connected)

Next, pulse resistance change characteristics when the resistance change is caused by actually applying the electric pulse to the variable resistance element itself (without parallel resistance) (FIG. 5(a)) and when the resistance change is caused by applying the electric pulse to the variable resistance element connected in parallel to the parallel resistance of 100 kΩ (the nonvolatile memory element according to the present invention) (FIG. 5(b)).

Each of FIG. 5(a) and FIG. 5(b) is a diagram showing a relationship between the number of times an electric pulse is applied (horizontal axis) and a resistance value, regarding a conventional nonvolatile memory element without parallel resistance (FIG. 5(a)) and the nonvolatile memory element according to the present invention (FIG. 5(b), parallel resistance is 100 kΩ).

Figure 6:
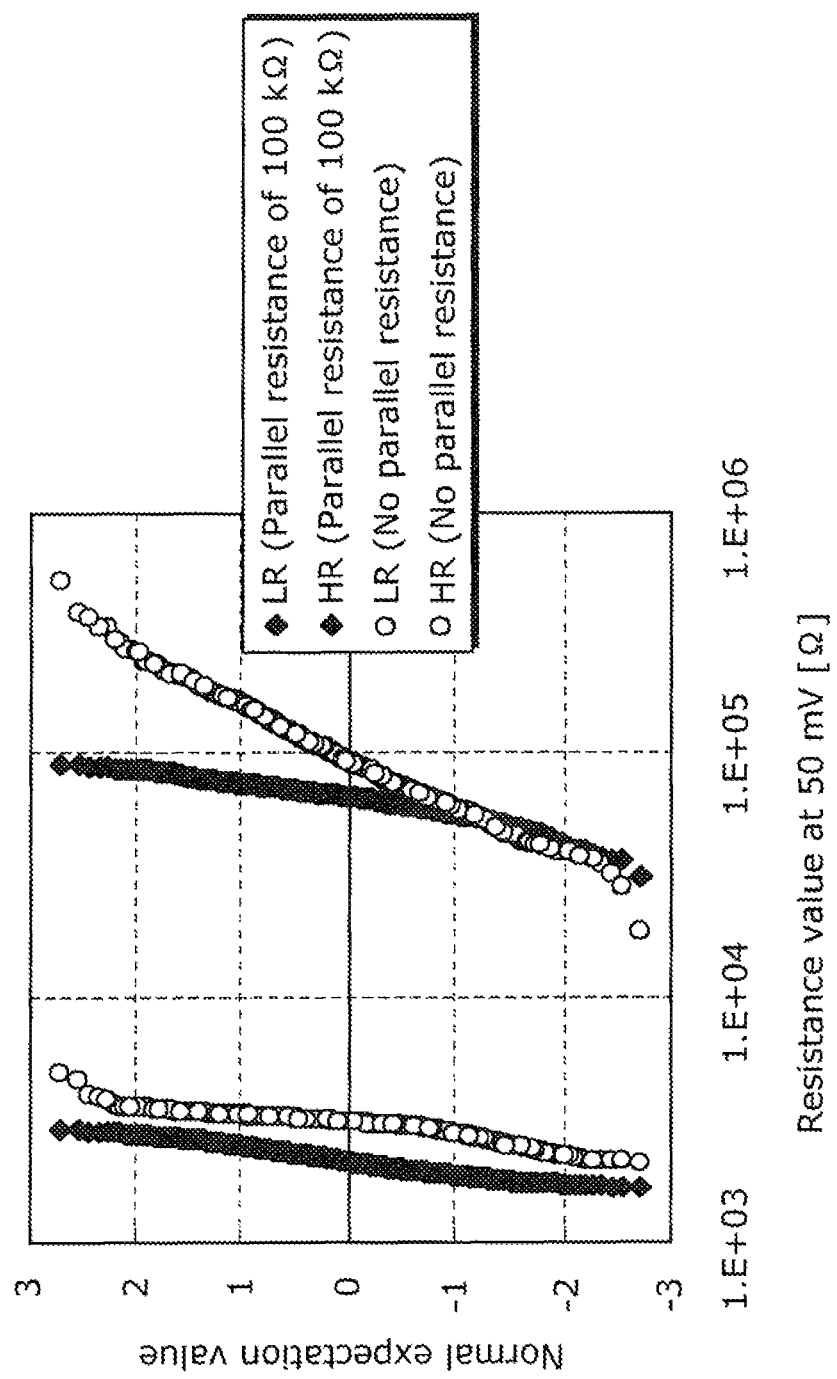
FIG. 6 is a diagram showing a variation in pulse resistance change characteristics of the variable resistance element itself and a variation in pulse resistance change characteristics of the nonvolatile memory element in which the variable resistance element is connected to the parallel resistance of 100 kΩ.

FIG. 6 is a diagram showing a normal distribution of resistance values in a low resistance state (LRs) and resistance values in a high resistance state (HRs) of each of the elements.

Here, the resistance values of the elements in the case where two types of electric pulses having the pulse width of 500 ns, that is, a positive voltage of 3.2 V and a negative voltage of −2.0 V, are repeatedly applied between the first electrode and the second electrode in a alternate manner are measured. The resistance values are measured by measuring a flowing current resulting from application of the weak voltage of 50 mV that is lower than a threshold voltage for resistance change (e.g., about 1 V) after each pulse is applied.

Figure 5:
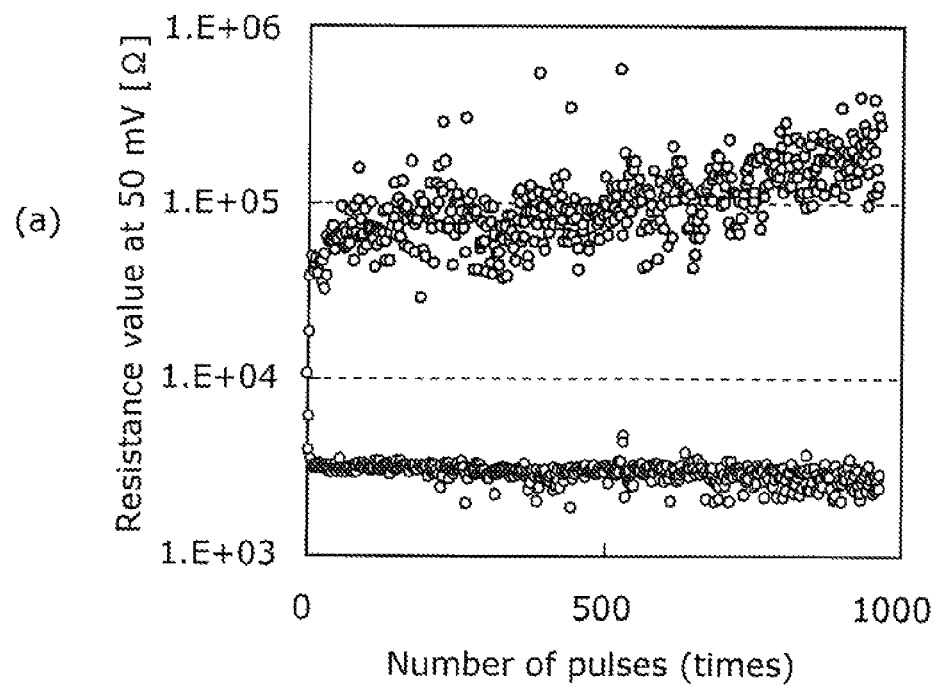
FIG. 5(a) is a diagram showing pulse resistance change characteristics of a variable resistance element itself.
FIG. 5(b) is a diagram showing pulse resistance change characteristics of a nonvolatile memory element in which the variable resistance element is connected to parallel resistance of 100 kΩ.
Figure 5:
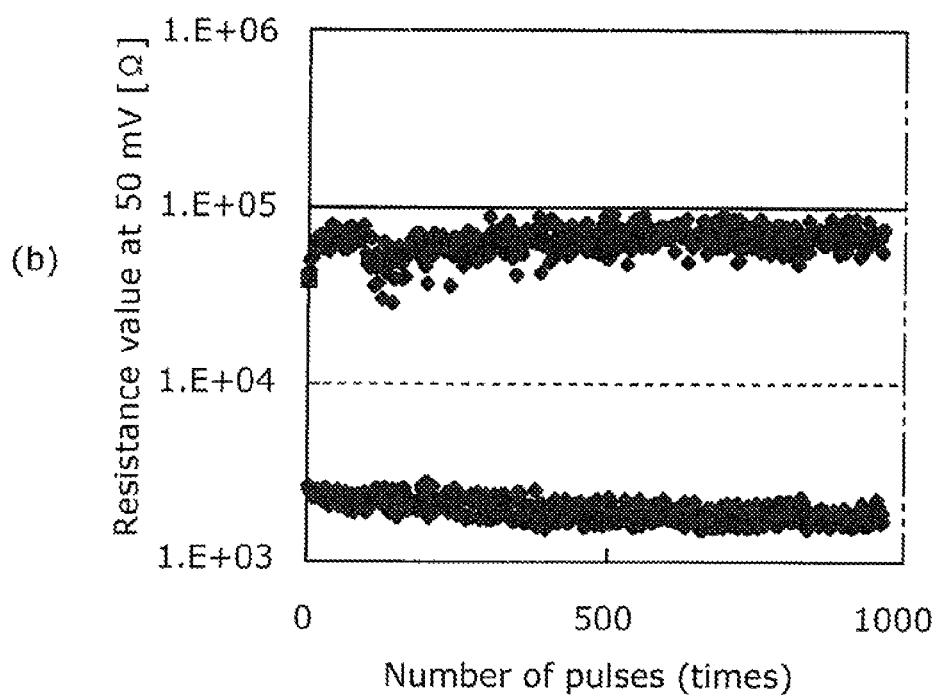

As is clear from FIG. 5 and FIG. 6, in terms of the resistance values in the high resistance state (HRs) in particular, the HRs greatly vary when there is no parallel resistance (the median of 95 kΩ, the minimum value of 11 kΩ, and the maximum value of 540 kΩ), whereas the variation is significantly reduced when there is the parallel resistance of 100 kΩ (the median of 66 kΩ, the minimum value of 31 kΩ, and the maximum value of 90 kΩ). Here, the variation in resistance value of the resistance element itself can be calculated as the median of 194 kΩ, the minimum value of 45 kΩ, and the maximum value of 900 kΩ.

(Embodiment 1)

Next, a nonvolatile memory element according to Embodiment 1 of the present invention shall be described.

Figure 7A:
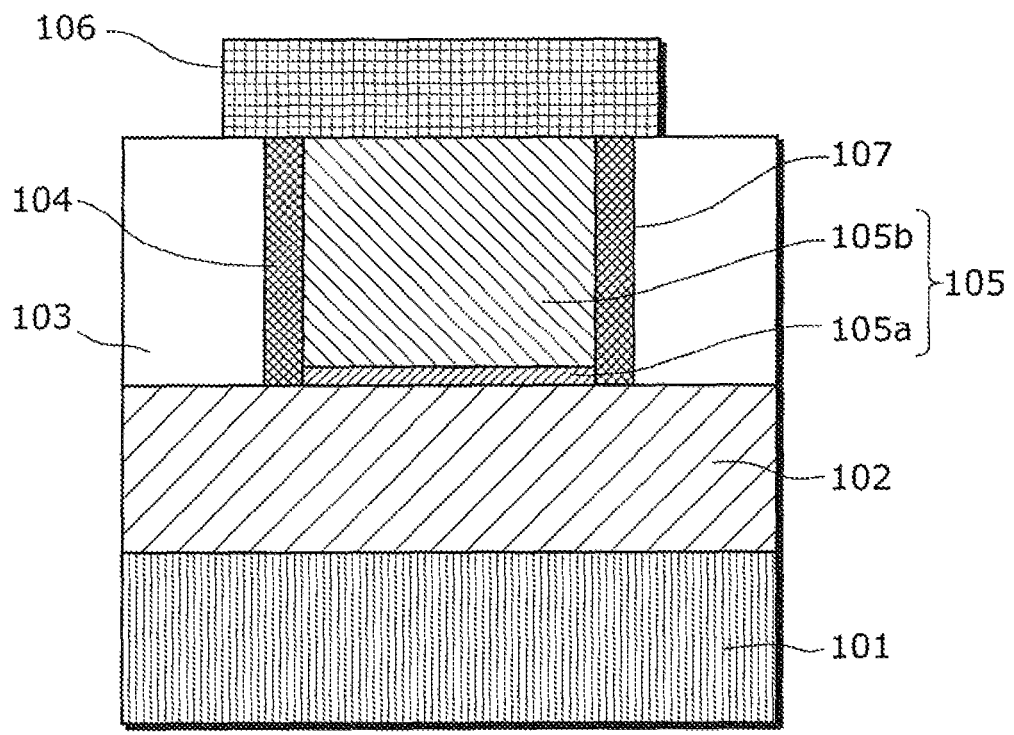
FIG. 7A is a cross-sectional view showing a nonvolatile memory element according to Embodiment 1 of the present invention.
Figure 7B:
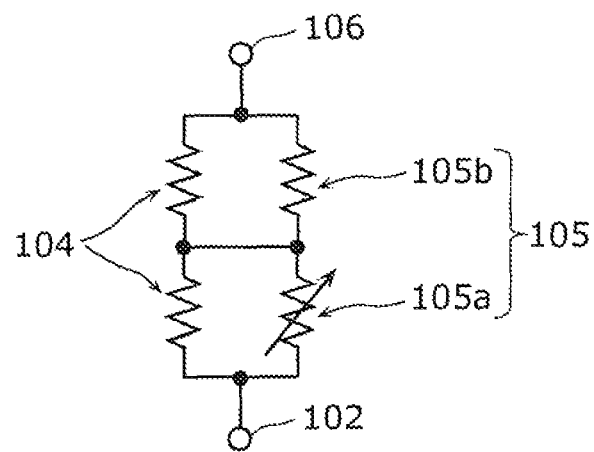
FIG. 7B is a diagram showing an equivalent circuit of the nonvolatile memory element according to Embodiment 1 of the present invention.

FIG. 7A shows a schematic cross-sectional view of a nonvolatile memory element itself according to Embodiment 1 of the present invention, and FIG. 7B shows an equivalent circuit of the nonvolatile memory element. The nonvolatile memory element includes: a first electrode 102; a second electrode 106; a variable resistance layer 105 which is formed between the first electrode 102 and the second electrode 106, is electrically connected to the first electrode 102 and the second electrode 106, and reversibly changes between a high resistance state and a low resistance state according to a polarity of a voltage applied between the first electrode 102 and the second electrode 106; and a fixed resistance layer 104 which is formed between the first electrode 102 and the second electrode 106 and is electrically connected in parallel to at least a part of the variable resistance layer 105.

Here, an interlayer insulating layer 103 is formed to fill a space between the first electrode 102 and the second electrode 106, and the variable resistance layer 105 and the fixed resistance layer 104 are formed within a contact hole (opening) 107 which is a through-hole formed in the interlayer insulating layer 103.

The variable resistance layer 105 has a stacked structure of two layers including a high resistance layer 105a and a low resistance layer 105b. The under surface of the high resistance layer 105a is electrically connected to the first electrode 102, and the upper surface of the low resistance layer 105b is electrically connected to the second electrode 106.

At least a part of the fixed resistance layer 104 is electrically connected in parallel to the high resistance layer 105a. The fixed resistance layer 104 has an under surface electrically connected to the first electrode 102, an upper surface electrically connected to the second electrode 106, and side surfaces connected to the high resistance layer 105a and the low resistance layer 105b.

In the present embodiment, the fixed resistance layer 104 is formed to completely cover around at least a part of an inner wall of the contact hole 107, and the variable resistance layer 105 is formed inside the contact hole 107 and in such a manner that the space surrounded by the fixed resistance layer 104 is filled.

The following specifically describes such a nonvolatile memory element according to the present embodiment with reference to its materials and dimension examples. In the nonvolatile memory element, the first electrode 102 (platinum (Pt)) is formed on a substrate 101, and the interlayer insulating layer 103 (insulating layer composed mostly of $SiO_2$, SiN, or SiC and having the thickness of 50 nm) including a barrier layer is formed on the first electrode 102. The contact hole 107 (diameter of 130 nm) is formed through the interlayer insulating layer 103. The fixed resistance layer 104 ($TaO_2$ having the thickness of 10 nm) is formed on a side wall of the contact hole 107. The variable resistance layer 105 is filled inside the contact hole 107 in contact with the fixed resistance layers 104. Here, in the variable resistance layer 105, the high resistance layer 105a ($TaO_y$, 5 nm) and the low resistance layer 105b ($TaO_x$, 45 nm) are stacked in two layers in this order from the side of the first electrode 102. Here, it is assumed that the compositions x and y satisfy the relationship x<y<2.5. Further, the second electrode 106 (Pt) is formed in contact with both of the fixed resistance layer 104 and the variable resistance layer 105.

It is preferable that compositions x, y, and z of a Ta oxide used for the variable resistance layer 105 or the fixed resistance layer 104 have values which cause resistance values of the variable resistance layer 105 and the fixed resistance layer 104 to be in the same order. Consequently, a nearly equal electric field is applied to both of the variable resistance layer 105 and the fixed resistance layer 104. The variable resistance layer 105 has the stacked structure including the high resistance layer 105a ($TaO_y$) and the low resistance layer 105b ($TaO_x$), and thus most of an electric field is applied to the high resistance layer 105a, and a resistance change operation occurs when the electric field equal to or greater than a threshold value is applied. In contrast, a thickness of the fixed resistance layer 104 ($TaO_z$) in a depth direction is 50 nm which is the depth of the contact hole 107, and thus only an electric field equal to or less than the threshold value is applied and a resistance change does not occur.

In other words, an advantage that a variation in resistance value (overall resistance value) of the nonvolatile memory element is suppressed as the resistance value of the fixed resistance layer 104 is lower is enhanced, but a disadvantage that a difference (window) between a resistance value in a high resistance state and a resistance value in a low resistance state of the nonvolatile memory element is reduced is enhanced. Thus, generally, the resistance value of the fixed resistance layer 104 may be properly determined from a point of view of these tradeoff relationships (both of a point of view of suppressing the variation in resistance value of the nonvolatile memory element and a point of view of ensuring a window width).

More specifically, the resistance value of the fixed resistance layer 104 is preferably 0.1 to 10 times as large as a resistance value in a high resistance state of the variable resistance layer 105. In terms of compatibility of suppressing the variation in resistance value and ensuring the window, the resistance value of the fixed resistance layer 104 is preferably 0.5 to 2 times as large as the resistance value in the high resistance state of the variable resistance layer 105, and is further preferably in the same range as the resistance value in the high resistance state of the variable resistance layer 105.

For instance, when the resistance value of the fixed resistance layer 104 is 10 times as large as the maximum resistance value in the high resistance state of the variable resistance layer 105, that is, 900 kΩ, in comparison with the case where there is no fixed resistance layer 104, a range of the variation in resistance value is reduced by only about 13%, but a resistance change window is merely reduced in width by about 5%. In contrast, when the resistance value of the fixed resistance layer 104 is 0.1 times as large as the minimum resistance value in the high resistance state of the variable resistance layer 105, that is, 4.5 kΩ, in comparison with the case where there is no fixed resistance layer 104, the range of the variation in resistance value is reduced by about 99%, and the variation is almost eliminated. However, the resistance change window is significantly reduced to about one tenth in width.

An electric equivalent circuit of the nonvolatile memory element according to the present embodiment is a circuit shown in FIG. 7B. To put it differently, the circuit includes the variable resistance layer 105 and the fixed resistance layer 104 that are connected in parallel between the first electrode 102 and the second electrode 106. The variable resistance layer 105 is expressed as series connection between the high resistance layer 105a serving as the variable resistance element and the low resistance layer (parent body) 105b serving as the fixed resistance. In contrast, the fixed resistance layer 104 is formed in contact with the variable resistance layer 105, and thus the fixed resistance layer 104 is expressed as series connection of two resistances each of which is connected in parallel to a corresponding one of the high resistance layer 105a and the low resistance layer 105b.

(Compositions and Resistivities of Fixed Resistance Layer and Variable Resistance Layer According to Embodiment 1)

Next, a method of determining a film thickness and a resistivity when $TaO_z$ is used as the fixed resistance layer 104 shall be described.

Figure 8:
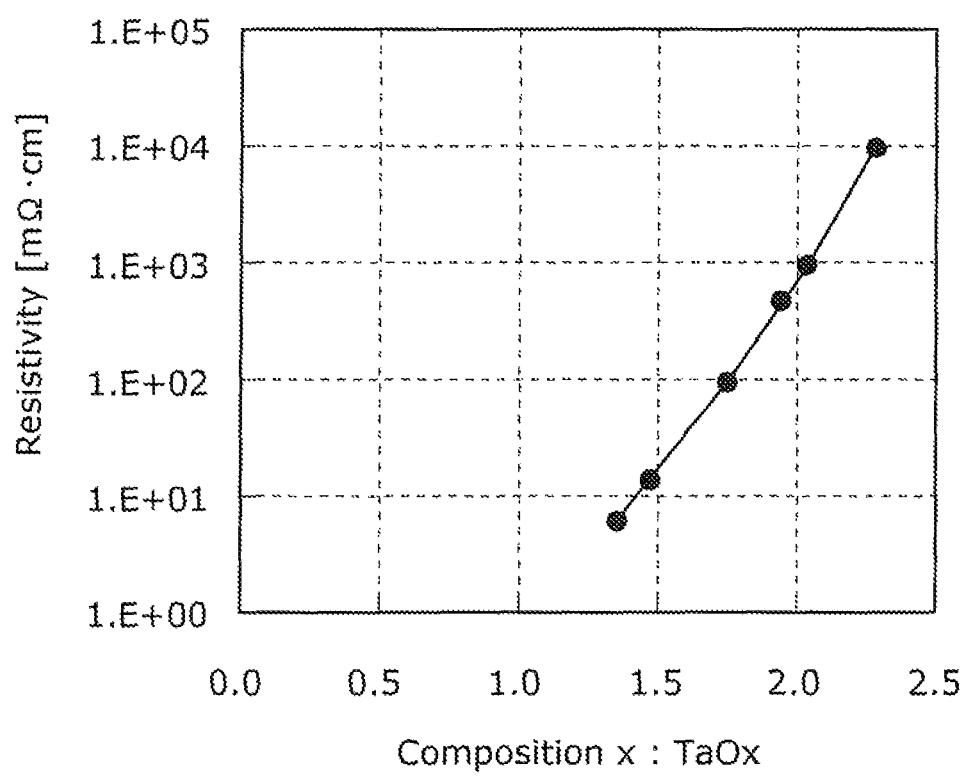
FIG. 8 is a diagram showing a relationship between a composition x of $TaO_x$ and a film resistivity.

FIG. 8 shows a relationship between a composition and a resistivity of $TaO_z$ formed by sputtering.

Here, film formation conditions are as follows: the ultimate pressure of $6.0 \times 10^{-4}$ Pa, the DC output of 1000 W, a flow of Ar at 20 sccm, and a change of a flow of $O_2$ at between 14.3 and 24 sccm under the film formation temperature of 25 degrees Celsius. In addition, pressure at the time of sputtering is about 2.0 Pa.

It is clear that a film having a resistivity widely ranging from 6 mΩcm to 10000 mΩcm can be obtained by controlling the composition z of $TaO_z$ with the flow of $O_2$.

(Side Wall Fixed Resistance Layer)

Here, where a diameter and a depth of the contact hole 107 are 2r and t in FIG. 7, respectively, a resistance value R when the fixed resistance layer 104 is formed as much as a thickness d on a side wall of the contact hole 107 can be expressed as below.

$$R = \frac{\rho \cdot t}{\pi r^2 - \pi(r-d)^2} \qquad [\text{Math. 3}]$$

Figure 9:
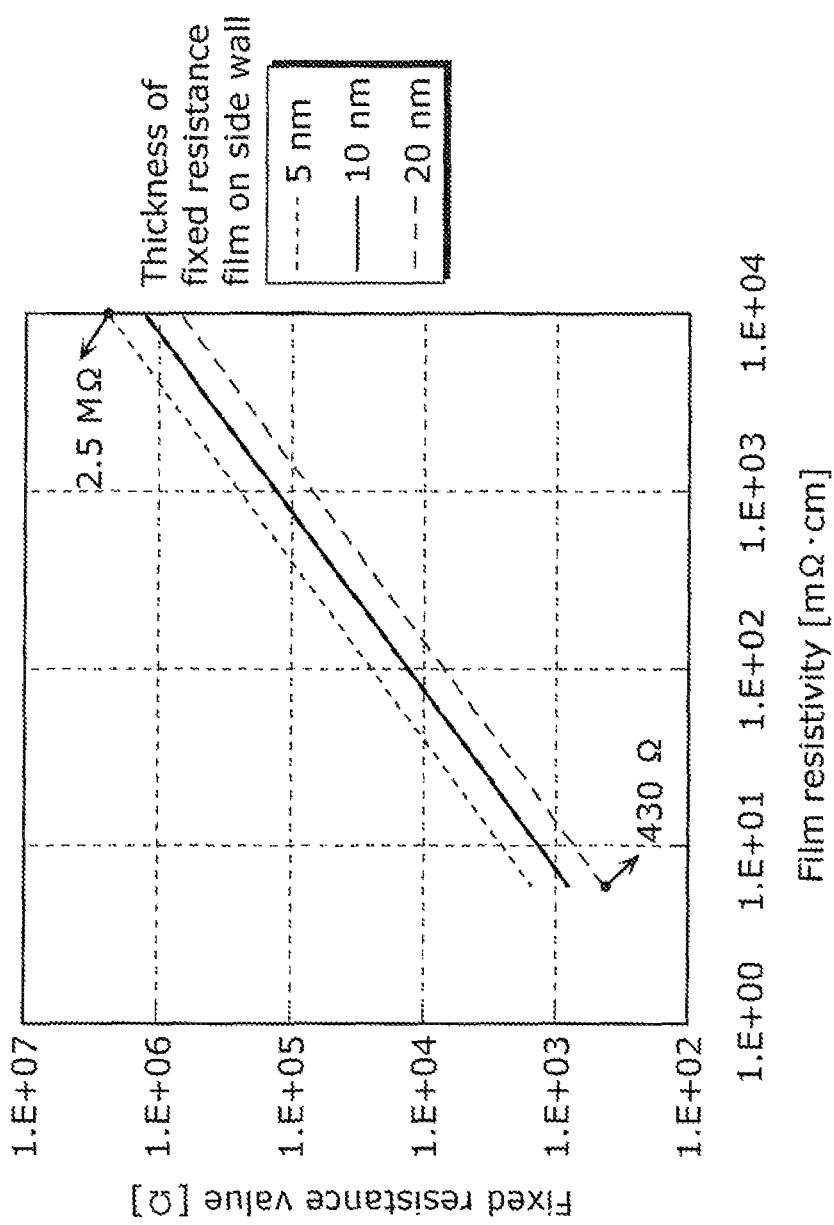
FIG. 9 is a diagram showing a relationship between a film resistivity and a fixed resistance value when a thickness of a fixed resistance layer on a side wall is changed, in the nonvolatile memory element according to Embodiment 1 of the present invention.

When the thickness of the side wall is changed between 5 nm and 20 nm and the resistivity of the fixed resistance layer 104 is changed between 6 mΩcm and 10000 mΩcm with the diameter of the contact hole 107 being 130 nm and the depth of the contact hole 107 being 50 nm, as shown in FIG. 9, it is possible to arbitrarily determine, within a range of 430Ω to 2.5 MΩ, a resistance value of the fixed resistance layer 104 which is to be obtained. It is to be noted that FIG. 9 is a diagram showing a relationship between a film resistivity and a fixed resistance value when a thickness of a fixed resistance layer on a side wall is changed (5 nm, 10 nm, and 20 nm), in the nonvolatile memory element according to Embodiment 1 of the present invention.

For example, a demand for a desired resistance value of about 100 kΩ can be met by adjusting a resistivity with respect to a value of a film thickness to be easily formed, as in a situation where a resistivity is adjusted to 750 mΩcm when the thickness of the side wall is 10 nm (solid line in FIG. 9).

When the resistivity of the fixed resistance layer 104 ($TaO_z$) is 750 mΩcm, it is clear from FIG. 8 that a value of the composition z is z=1.99.

(Manufacturing Method According to Embodiment 1)

Figure 10A:
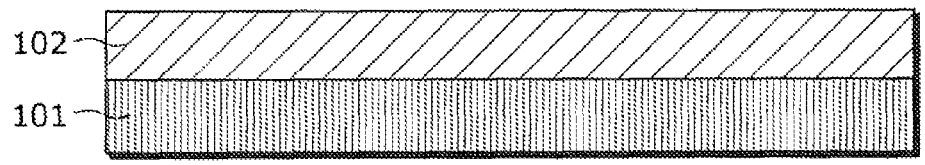
FIG. 10A(a) to FIG. 10A(d) are process charts showing a manufacturing method of the nonvolatile memory element according to Embodiment 1 of the present invention.
Figure 10A:
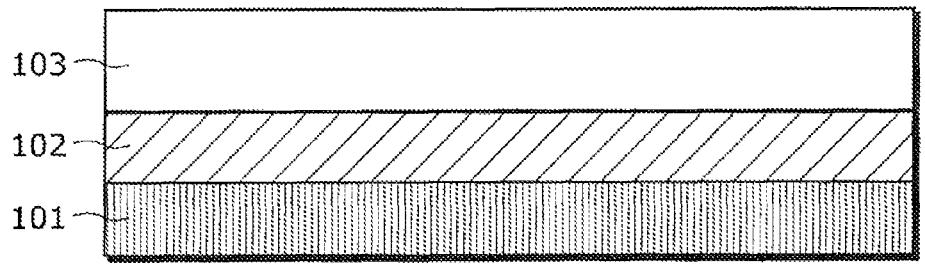
Figure 10A:
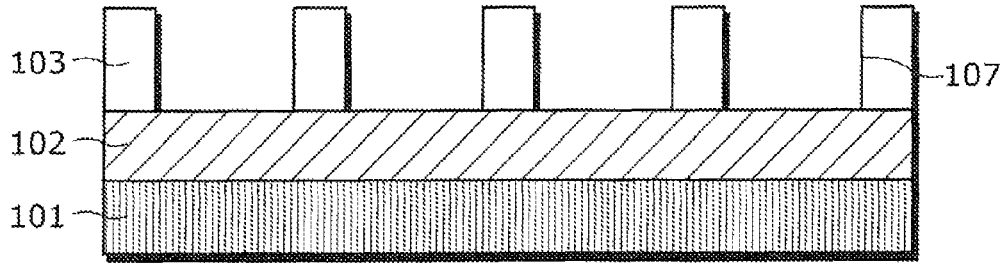
Figure 10A:
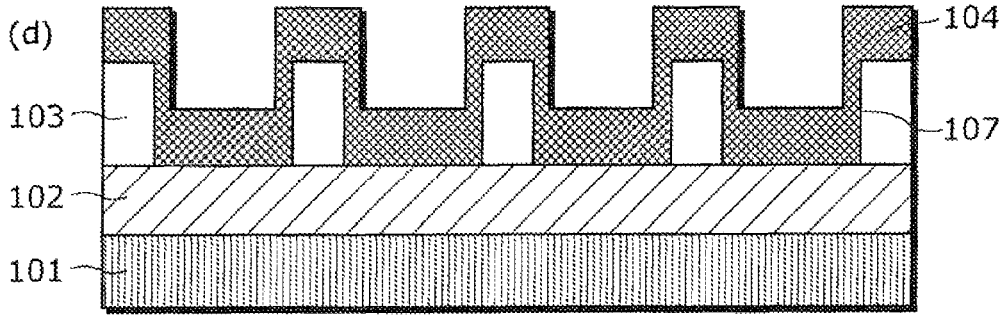

The following describes a manufacturing method of the nonvolatile memory element according to the present embodiment. FIG. 10A(a) to FIG. 10B(d) sequentially show a process flow of the nonvolatile memory element according to the present embodiment.

First, as shown in FIG. 10A(a), a plurality of first electrodes 102 each of which is made of Pt and has the wiring width of 300 nm and the thickness of 200 nm are formed on the substrate 101 so as to extend in a predetermined direction. Each first electrode 102 becomes a first wire. After a trench (ditch) for embedding a wire in an insulating layer is formed, the first electrode 102 (Pt) is formed by sputtering. Here, a damascene process in which the embedding is performed with the CMP (chemical mechanical polishing) technique may be used (not shown).

Next, as shown in FIG. 10A(b), after a barrier layer (SiN, SiC, and so on) is formed, an interlayer insulating layer ($SiO_2$) is deposited through, for instance, a CVD process, so as to be subsequently formed as the interlayer insulating layer 103 having the thickness of 50 nm, using the CMP technique.

Next, as shown in FIG. 10A(c), by a dry etching method, the contact hole 107 having the diameter of 130 nm is dug through the interlayer insulating layer 103 until the contact hole 107 reaches the first electrode 102.

Next, as shown in FIG. 10A(d), the fixed resistance layer 104 made of $TaO_z$ is formed on the whole surface by sputtering. Here, it is noted that a thickness of a fixed resistance layer to be formed is determined in view of step coverage in sputtering. In the case where step coverage (a ratio of a side wall section to a planar section) is, for example, 10% when a fixed resistance layer having the thickness of 10 nm and made of $TaO_z$ is formed, forming a fixed resistance layer having the thickness of 100 nm on a planar section leads to formation of a fixed resistance layer having the thickness of 10 nm on the side wall of the contact hole 107. In the present process flow, it is preferable to use the sputtering when it is desired to actively thin the film thickness on side wall, and conversely it is preferable to use the CVD technique when it is desired to maintain the film thickness on side wall to an extent.

Figure 10B:
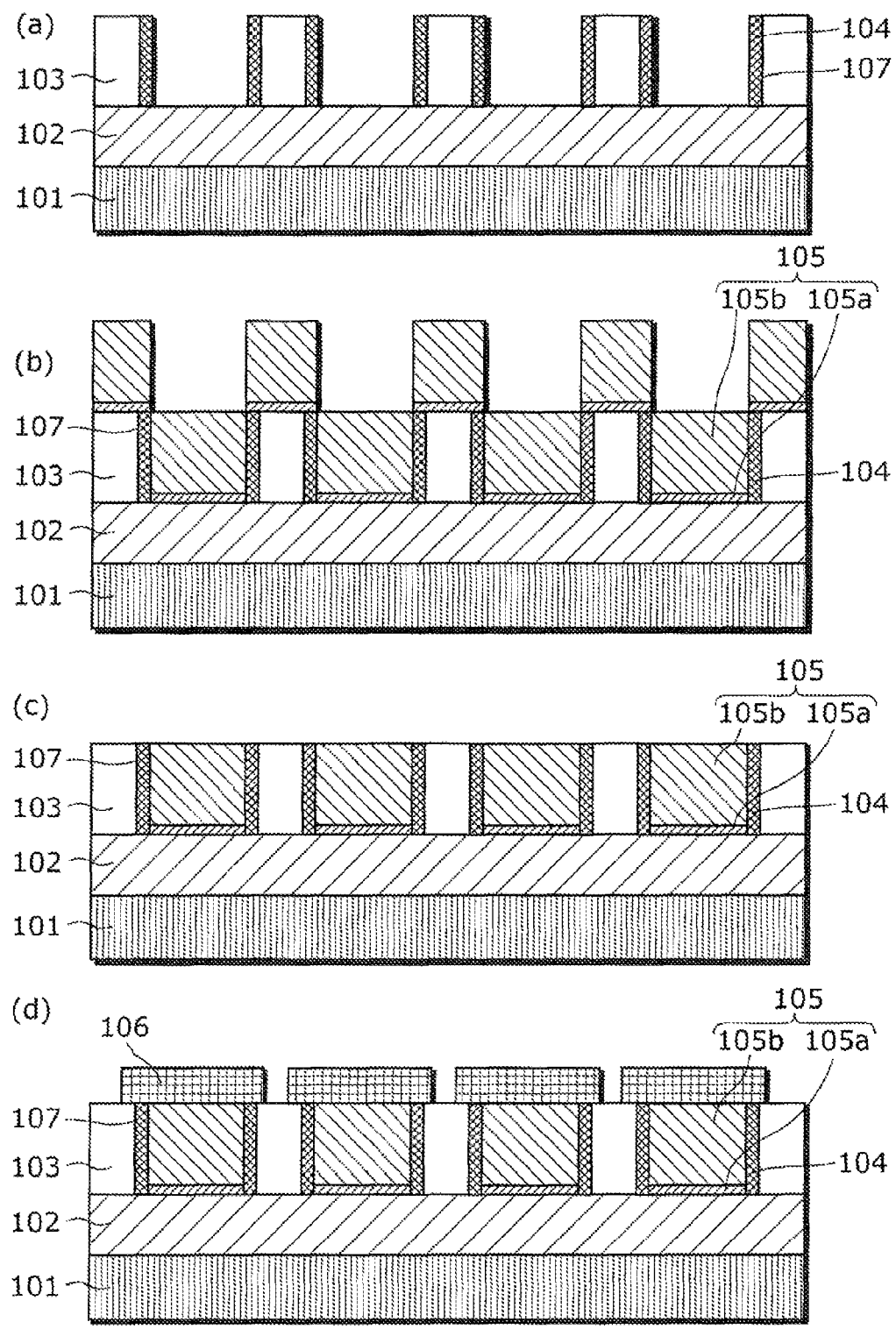
FIG. 10B(a) to FIG. 10B(d) are process charts showing the manufacturing method subsequent to FIG. 10A(d).

Next, as shown in FIG. 10B(a), the fixed resistance layer 104 on the interlayer insulating layer 103 is removed by etching back the whole surface. Here, the fixed resistance layer 104 on a base of the contact hole 107 is removed by etching back, and the fixed resistance layer 104 is formed on the side wall of the contact hole 107 in a self aligning manner.

Next, as shown in FIG. 10B(b), the high resistance layer 105a ($TaO_y$ (5 nm)) and the low resistance layer 105b ($TaO_x$ (45 nm)) of the variable resistance layer are formed in this order by, for instance, the sputtering, and a stacked structure of $TaO_x$ (45 nm)/$TaO_y$ (5 nm) is formed inside the contact hole 107.

Next, as shown in FIG. 10B(c), the variable resistance layer 105 which is deposited on the interlayer insulating layer 103 and the fixed resistance layer 104 is polished with the CMP technique so that the variable resistance layer 105 remains only inside the contact hole 107.

Lastly, as shown in FIG. 10B(d), a plurality of second electrodes 106 each of which is made of Pt and has the wiring width of 300 nm and the thickness of 200 nm are formed so as to extend in a predetermined direction. Each second electrode 106 is formed to cover a corresponding one of the contact holes 107 and cross the first wire, which is the first electrode 102, and becomes a second wire.

It is to be noted that, like the first electrode 102, after a trench for embedding a wire in the interlayer insulating layer 103 is formed, the second wire 106 (Pt) is formed by the sputtering. Here, a damascene process in which the embedding is performed with the CMP technique can be also used.

It is to be noted that although the first electrode 102 and the second electrode 106 which are in direct contact with the nonvolatile memory element are made of Pt in the present embodiment, each of the first electrode 102 and the second electrode 106 may be made of another electrode material such as Ta and a Ta compound, a rare metal material such as Cu, Au, Ir, Pd, Ru, and Rh, and a compound of these rare metal materials.

Furthermore, each of the first electrode 102 and the second electrode 106 may be made of a metal material generally used for semiconductor, for example, an Al-system wiring material such as W, Ti, TiN, and AlCu. Moreover, the variable resistance layer and the fixed resistance layer are both made of a tantalum oxide and can be formed even at room temperature in the present embodiment, and thus the substrate can be formed using a material other than Si.

Figure 11A:
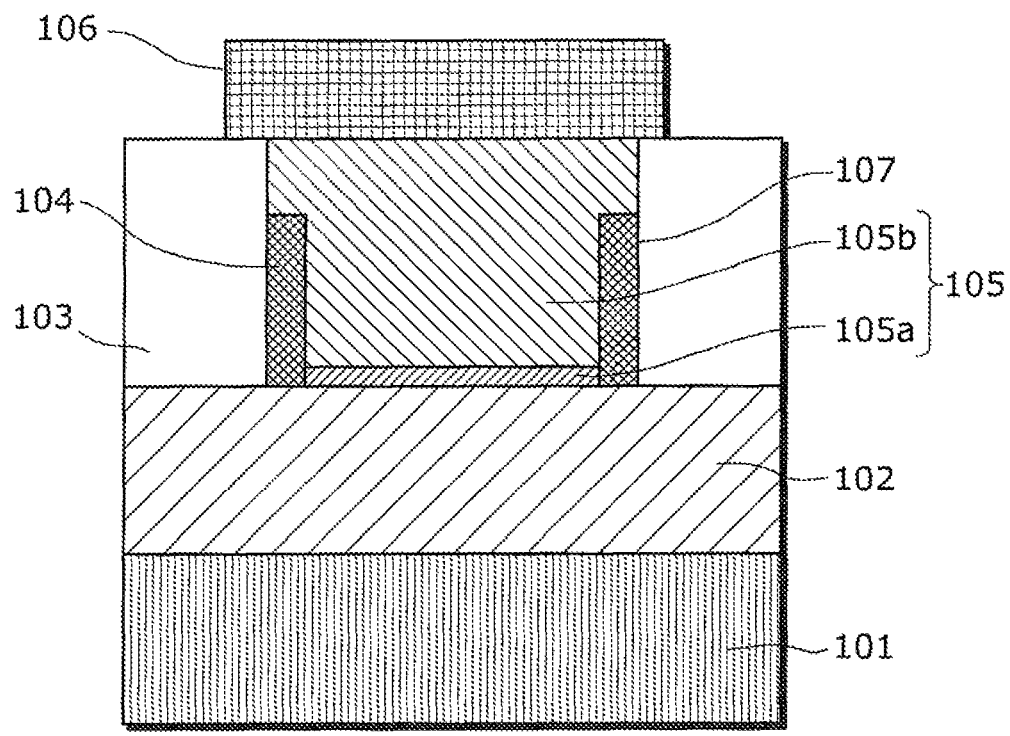
FIG. 11A is a cross-sectional view showing a modification of the nonvolatile memory element according to Embodiment 1 of the present invention.
Figure 11B:
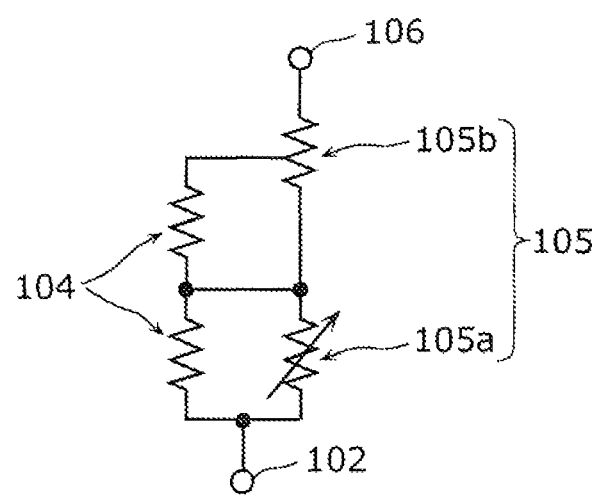
FIG. 11B is a diagram showing an equivalent circuit of the nonvolatile memory element according to the modification.

Furthermore, although the fixed resistance layer 104 is formed to cover the entire side wall of the contact hole 107, the fixed resistance layer 104 may be formed on a part of the side wall of the contact hole 107 as shown in FIG. 11A as long as at least the fixed resistance layer 104 is electrically connected in parallel to the high resistance layer 105a of the variable resistance layer 105. An equivalent circuit of a nonvolatile memory element according to such a modification is a circuit shown in FIG. 11B. Stated differently, one end of the fixed resistance layer 104 is connected to the first electrode 102, whereas the other end is not connected to the second electrode 106 but is in contact with the low resistance layer 105b. In such a nonvolatile memory element, it is necessary to form a height of the fixed resistance layer 104 covering the side wall so that a threshold electric field of a resistance change is not exceeded when a voltage is applied.

Further, although the fixed resistance layer 104 is made of TaO$_z$, the fixed resistance layer 104 may be made of a material having a desired resistivity such as TaON and Ta$_3$N$_{(5-x)}$. For instance, when the fixed resistance layer 104 is made of a material which does not easily cause a resistance change such as TaON and Ta$_3$N$_{(5-x)}$, it is necessary to give little thought about the height of the fixed resistance layer 104 covering the side wall, and to satisfy only conditions for a desired resistance value.

(Embodiment 2)

Next, a nonvolatile memory element according to Embodiment 2 of the present invention shall be described.

Figure 12A:
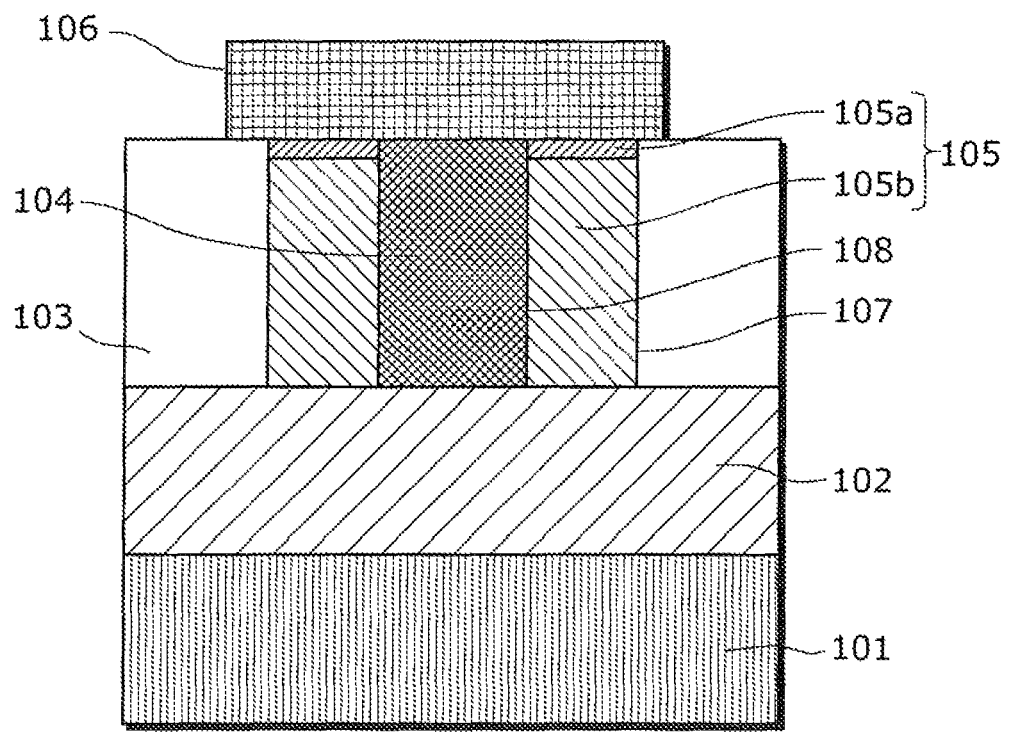
FIG. 12A is a cross-sectional view showing a nonvolatile memory element according to Embodiment 2 of the present invention.
Figure 12B:
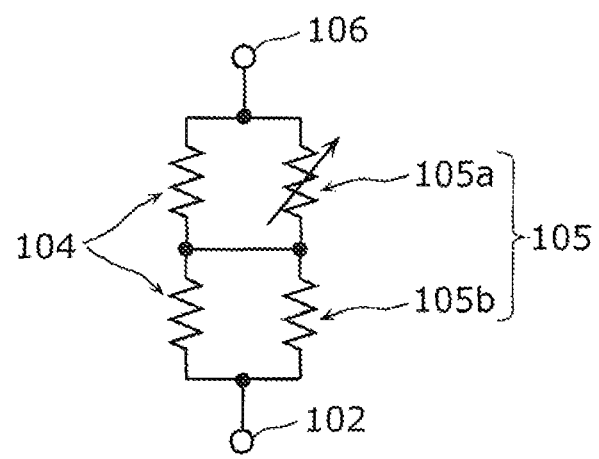
FIG. 12B is a diagram showing an equivalent circuit of the nonvolatile memory element according to Embodiment 2 of the present invention.

FIG. 12A shows a schematic cross-sectional view of a nonvolatile memory element itself according to Embodiment 2 of the present invention, and FIG. 12B shows an equivalent circuit of the nonvolatile memory element. In the nonvolatile memory element according to the present invention, a first electrode 102 (Pt) is formed on a substrate 101, and an interlayer insulating layer 103 (an insulating layer composed mainly of SiO2, SiN, or SIC and having the thickness of 50 nm) including a barrier layer is formed on the first electrode 102. A contact hole 107 (diameter of 130 nm) is formed through the interlayer insulating layer 103. A variable resistance layer 105 (stacked structure of TaO$_y$ (5 nm)/TaO$_x$ (45 nm) with the side wall thickness of 30 nm) is formed on a side wall of the contact hole 107. Here, it is assumed that the compositions x and y satisfy the relationship x<y<2.5. The fixed resistance layer 104 is filled inside the contact hole 107 in contact with the variable resistance layer 105. Further, a second electrode 106 (Pt) is formed in contact with both of the fixed resistance layer 104 and the variable resistance layer 105.

In FIG. 12A, the nonvolatile memory element according to the present embodiment differs from Embodiment 1 in that a positional relationship (inside or outside) of the fixed resistance layer 104 formed inside the contact hole 107 and the variable resistance layer 105 is replaced. In other words, the variable resistance layer 105 is formed on a side wall of the contact hole (opening), and the fixed resistance layer 104 is formed to fill a space surrounded by the variable resistance layer 105. With this structure, as shown in FIG. 12B, an equivalent circuit of the nonvolatile memory element according to the present embodiment is a circuit formed by connecting the variable resistance layer 105 turned upside down in the equivalent circuit according to Embodiment 1. Therefore, in FIG. 12A and FIG. 12B, it does not matter which of the high resistance layer 105a and the low resistance layer 105b included in the variable resistance layer 105 is placed on top of the other.

It is preferable that compositions x, y, and z of a Ta oxide used for the variable resistance layer 105 or the fixed resistance layer 104 have values which cause resistance values of the variable resistance layer 105 and the fixed resistance layer 104 to be in the same order. Consequently, a nearly equal electric field is applied to both of the variable resistance layer 105 and the fixed resistance layer 104. The variable resistance layer 105 has a stacked structure including the high resistance layer 105a (TaO$_y$) and the low resistance layer 105b (TaO$_x$), and thus most of an electric field is applied to the high resistance layer 105a, and a resistance change operation occurs when the electric field equal to or greater than a threshold value is applied. In contrast, a thickness of the fixed resistance layer TaO$_z$ in a depth direction is 50 nm which is the depth of the contact hole 107, and thus only an electric field equal to or less than the threshold value is applied, and a resistance change does not occur.

(Compositions and Resistivities of Fixed Resistance Layer and Variable Resistance Layer According to Embodiment 2)

When a variable resistance layer is formed as much as a thickness d on a side wall of the contact hole 107 having a diameter 2r and a depth t, the diameter of the hole is expressed as 2(r−d). Where a resistance value in the case where a fixed resistance layer is embedded in the hole is R, the following relationship holds.

$$R = \frac{\rho \cdot t}{\pi (r-d)^2} \qquad \text{[Math. 4]}$$

Figure 13:
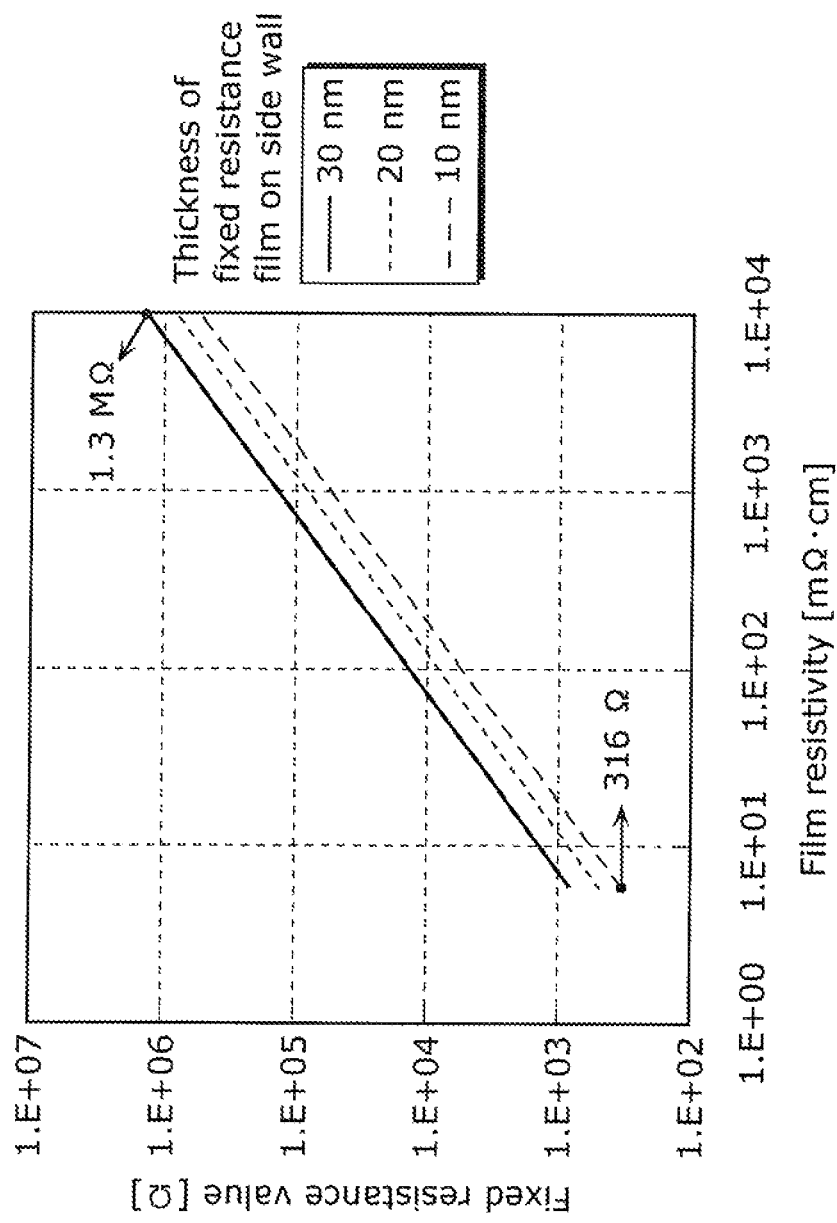
FIG. 13 is a diagram showing a relationship between a film resistivity and a fixed resistance value when a thickness of a fixed resistance layer on a side wall is changed, in the nonvolatile memory element according to Embodiment 2 of the present invention.

When the thickness of the side wall (variable resistance layer 105) is changed between 10 nm and 30 nm and the resistivity of the fixed resistance layer 104 is changed between 6 mΩcm and 10000 mΩcm with the diameter and depth of the contact hole 107 being 130 nm and 50 nm, as shown in FIG. 13, it is possible to arbitrarily determine, within a range of 320Ω to 1.3 MΩ, a resistance value of the fixed resistance layer 104 which is to be obtained. It is to be noted that FIG. 13 is a diagram showing a relationship between a film resistivity and a fixed resistance value of the fixed resistance layer when the thickness of the variable resistance layer on the side wall is changed (10 nm, 20 nm, and 30 nm), in the nonvolatile memory element according to Embodiment 2 of the present invention.

For example, a demand for a desired resistance value of about 100 kΩ can be met by adjusting a resistivity with respect to a value of a film thickness to be easily formed, as in a situation where a resistivity is adjusted to 770 mΩcm when the thickness of the side wall is 30 nm.

When the resistivity of the fixed resistance layer 104 (TaO$_z$) is 770 mΩcm, a value of the composition z is z=1.99.

(Manufacturing Method According to Embodiment 2)

Figure 14A:
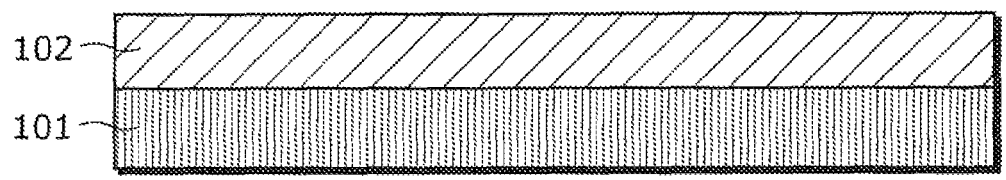
FIG. 14A(a) to FIG. 14A(d) are process charts showing a manufacturing method of the nonvolatile memory element according to Embodiment 2 of the present invention.
Figure 14A:
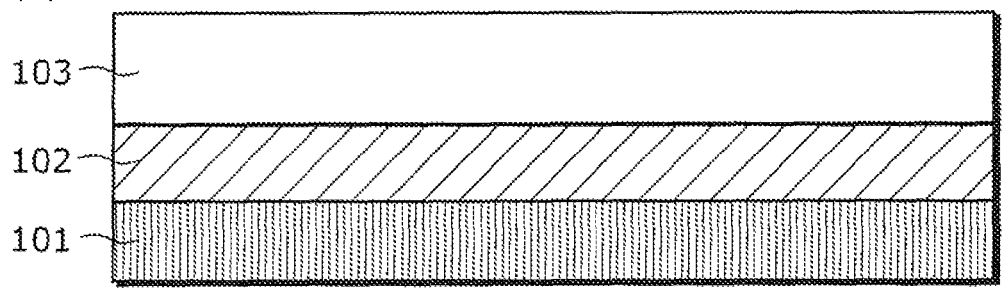
Figure 14A:
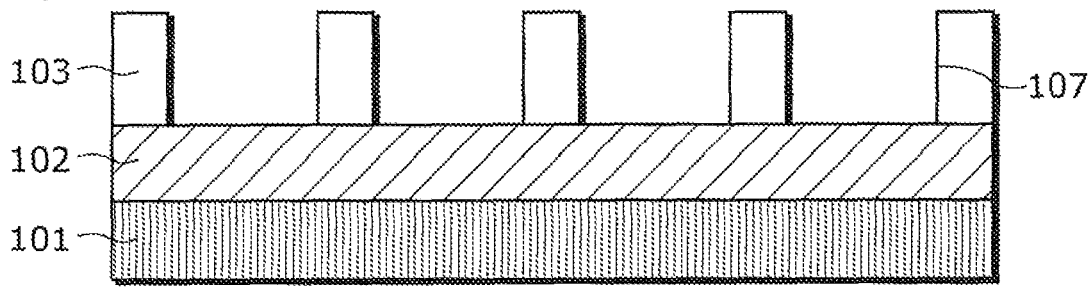
Figure 14A:
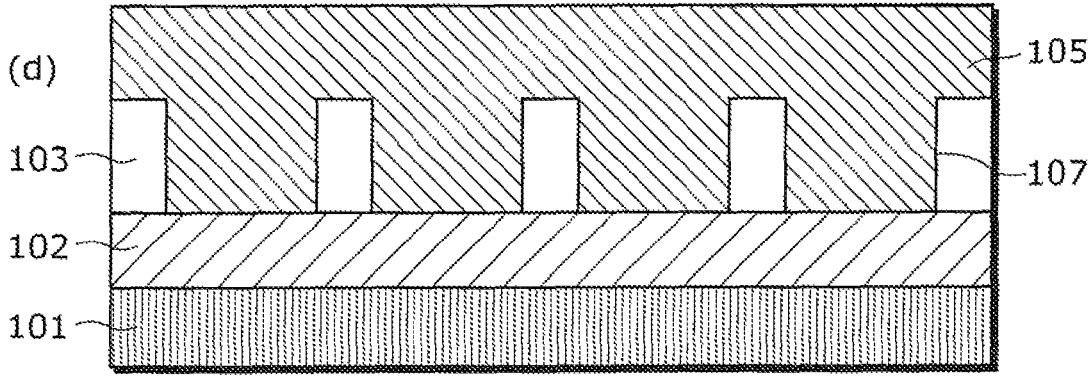

The following describes a manufacturing method of the nonvolatile memory element according to the present embodiment. FIG. 14A(a) to FIG. 14C(d) sequentially show a process flow of the nonvolatile memory element according to the present embodiment.

First, as shown in FIG. 14A(a), a plurality of first electrodes 102 each of which is made of Pt and has the wiring width of 300 nm and the thickness of 200 nm are formed on the substrate 101 so as to extend in a predetermined direction. Each first electrode 102 becomes a first wire. After a trench (ditch) for embedding a wire in an insulating layer is formed, the first electrode 102 (Pt) is formed by sputtering. Here, a damascene process in which the embedding is performed with the CMP (chemical mechanical polishing) technique may be used (not shown).

Next, as shown in FIG. 14A(b), after a barrier layer (SiN, SiC, and so on) is formed, an interlayer insulating layer (SiO$_2$) is deposited through, for instance, a CVD process, so as to be subsequently formed as the interlayer insulating layer 103 having the thickness of 50 nm, using the CMP technique.

Next, as shown in FIG. 14A(c), by a dry etching method, the contact hole 107 having the diameter of 130 nm is dug through the interlayer insulating layer 103 until the contact hole 107 reaches the first electrode 102.

Next, as shown in FIG. 14A(d), the variable resistance layer 105 made of TaO$_x$ is formed on the whole surface by sputtering. Here, at least the variable resistance layer 105 (low resistance layer 105b) having a thickness greater than a predetermined thickness may be formed on the side wall of the contact hole 107.

Figure 14B:
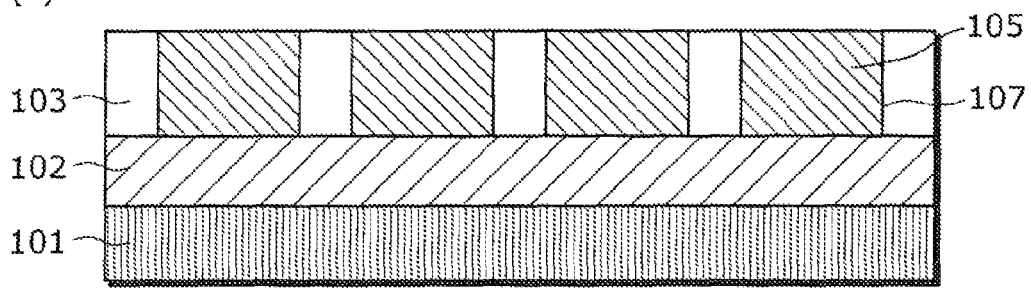
FIG. 14B(a) to FIG. 14B(d) are process charts showing the manufacturing method subsequent to FIG. 14A(d).
Figure 14B:
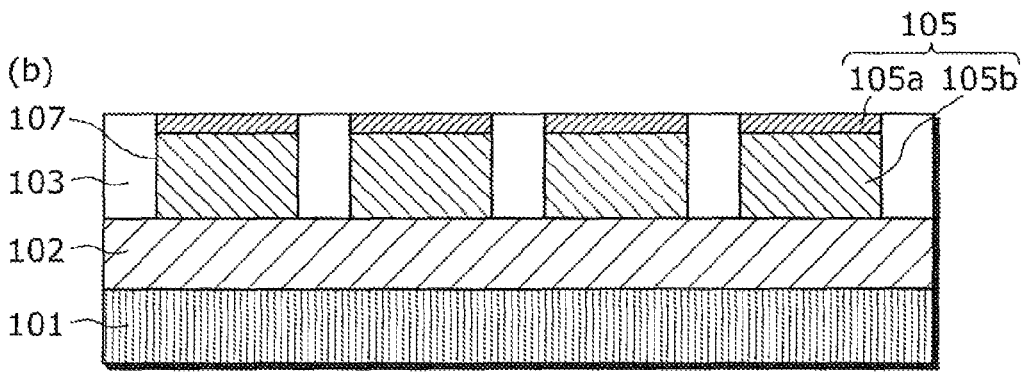
Figure 14B:
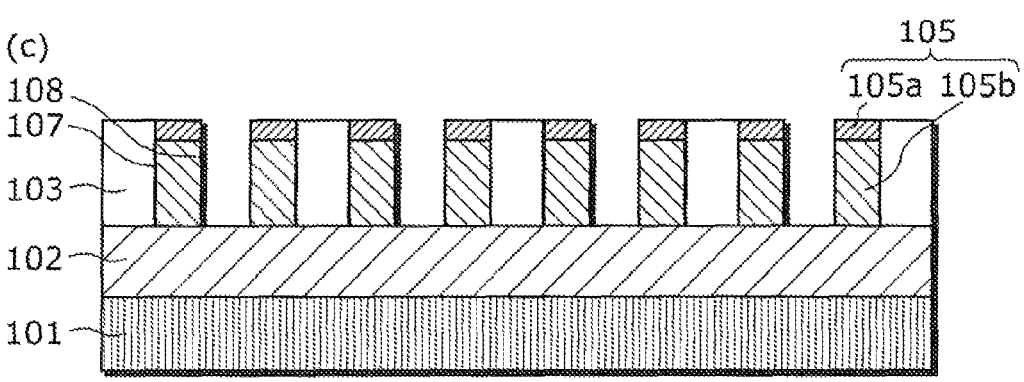
Figure 14B:
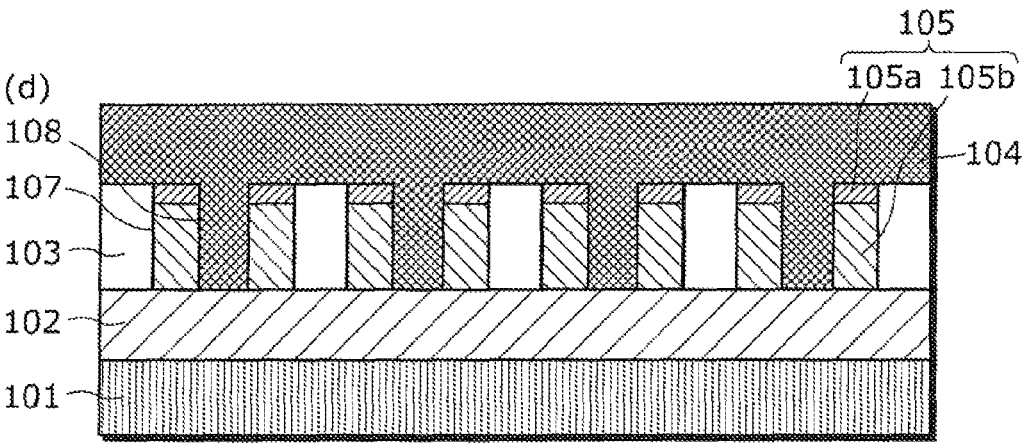

Next, as shown in FIG. 14B(a), the variable resistance layer 105 which is deposited on the interlayer insulating layer 103 is polished with the CMP technique so that the variable resistance layer 105 remains only inside the contact hole 107.

Subsequently, as shown in FIG. 14B(b), the surface of the variable resistance layer 105 is oxidized by oxygen plasma treatment (e.g., 200 W for 4 sec at room temperature), so as to form the high resistance layer 105a having the thickness of 5 nm. The unoxidized variable resistance layer 105 having the thickness of remaining 45 nm becomes the low resistance layer 105b.

Next, as shown in FIG. 14B(c), by a dry etching method following a lithography process, a contact hole 108 having the diameter of 70 nm is dug through the variable resistance layer 105 until the contact hole 108 reaches the first electrode 102 (photoresist pattern not shown).

Next, as shown in FIG. 14B(d), the fixed resistance layer 104 made of $TaO_z$ is formed on the whole surface by sputtering.

Figure 14C:
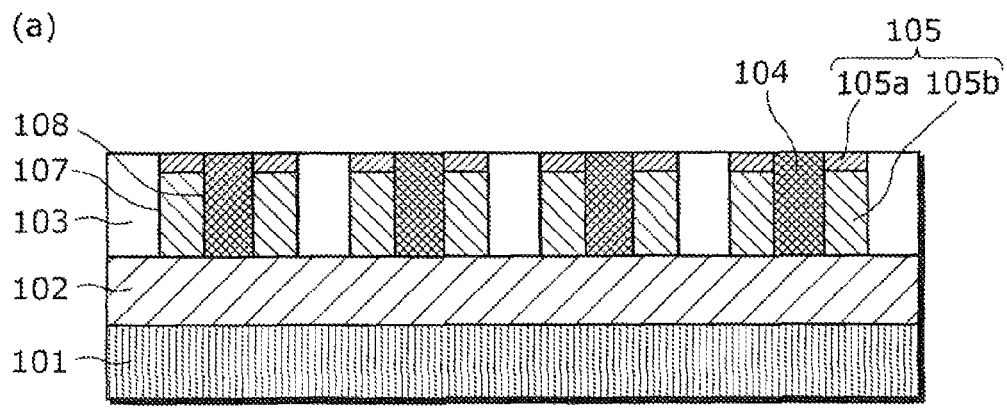
FIG. 14C(a) and FIG. 14C(b) are process charts showing the manufacturing method subsequent to FIG. 14B(d).
Figure 14C:
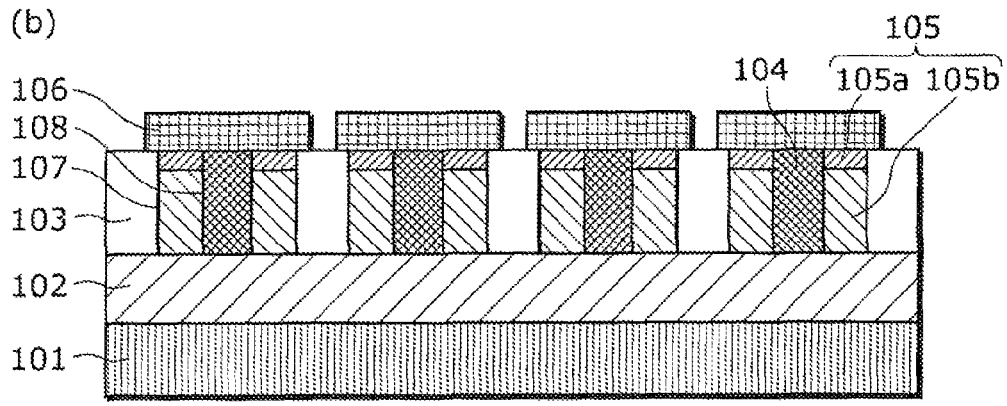

Next, as shown in FIG. 14C(a), the fixed resistance layer 104 which is deposited on the interlayer insulating layer 103 and the variable resistance layer 105 is polished with the CMP technique so that the fixed resistance layer 104 remains only inside the contact hole 108.

Lastly, as shown in FIG. 14C(b), a plurality of second electrodes 106 each of which is made of Pt and has the wiring width of 300 nm and the thickness of 200 nm are formed so as to extend in a predetermined direction. Each second electrode 106 is formed to cover a corresponding one of the contact holes 107 and cross the first wire, which is the first electrode 102, and becomes a second wire.

It is to be noted that, like the first electrode 102, after a trench for embedding a wire in the interlayer insulating layer 103 is formed, the second wire 106 (Pt) is formed by the sputtering. Here, a damascene process in which the embedding is performed with the CMP technique can be also used.

Furthermore, although the first electrode 102 and the second electrode 106 which are in direct contact with the nonvolatile memory element are made of Pt in the present embodiment, each of the first electrode 102 and the second electrode 106 may be made of another electrode material such as Ta and a Ta compound, a rare metal material such as Cu, Au, Ir, Pd, Ru, and Rh, and a compound of these rare metal materials.

Moreover, each of the first electrode 102 and the second electrode 106 may be made of a metal material generally used for semiconductor, for example, an Al-system wiring material such as W, Ti, TiN, and AlCu. Furthermore, the substrate can be formed using a material other than Si in the present embodiment.

Figure 15A:
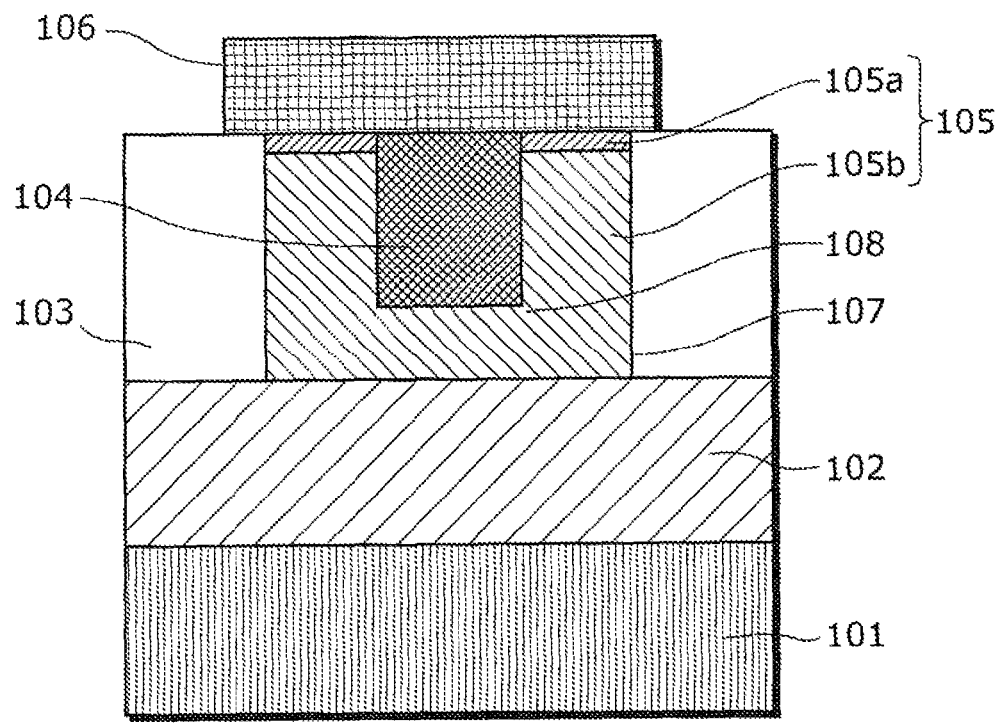
FIG. 15A is a cross-sectional view showing a modification of the nonvolatile memory element according to Embodiment 2 of the present invention.
Figure 15B:
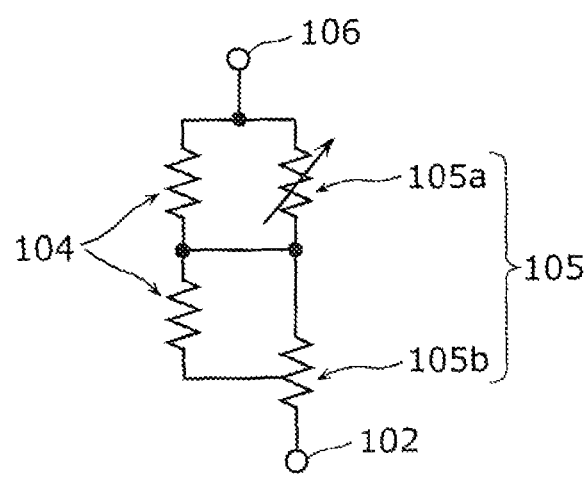
FIG. 15B is a diagram showing an equivalent circuit of the nonvolatile memory element according to the modification.

Moreover, although the fixed resistance layer 104 is formed through the variable resistance layer 105, the fixed resistance layer 104 may be formed not through the variable resistance layer 105 as shown in FIG. 15A as long as at least the fixed resistance layer 104 is electrically connected in parallel to the high resistance layer 105a of the variable resistance layer 105. An equivalent circuit of a nonvolatile memory element according to such a modification is a circuit shown in FIG. 15B. Stated differently, one end of the fixed resistance layer 104 is connected to the second electrode 106, whereas the other end is not connected to the first electrode 102 but is in contact with the low resistance layer 105b. In such a nonvolatile memory element, it is necessary to design the thickness of the fixed resistance layer 104 so that a threshold electric field of a resistance change is not exceeded when a voltage is applied.

Further, although the fixed resistance layer 104 is made of $TaO_z$, the fixed resistance layer 104 may be made of a material having a desired resistivity such as TaON and $Ta_3N_{(5-x)}$. For instance, when the fixed resistance layer 104 is made of a material which does not easily cause a resistance change such as TaON and $Ta_3N_{(5-x)}$, it is necessary to give little thought about the thickness of the fixed resistance layer 104, and to satisfy only conditions for a desired resistance value.

Figure 16:
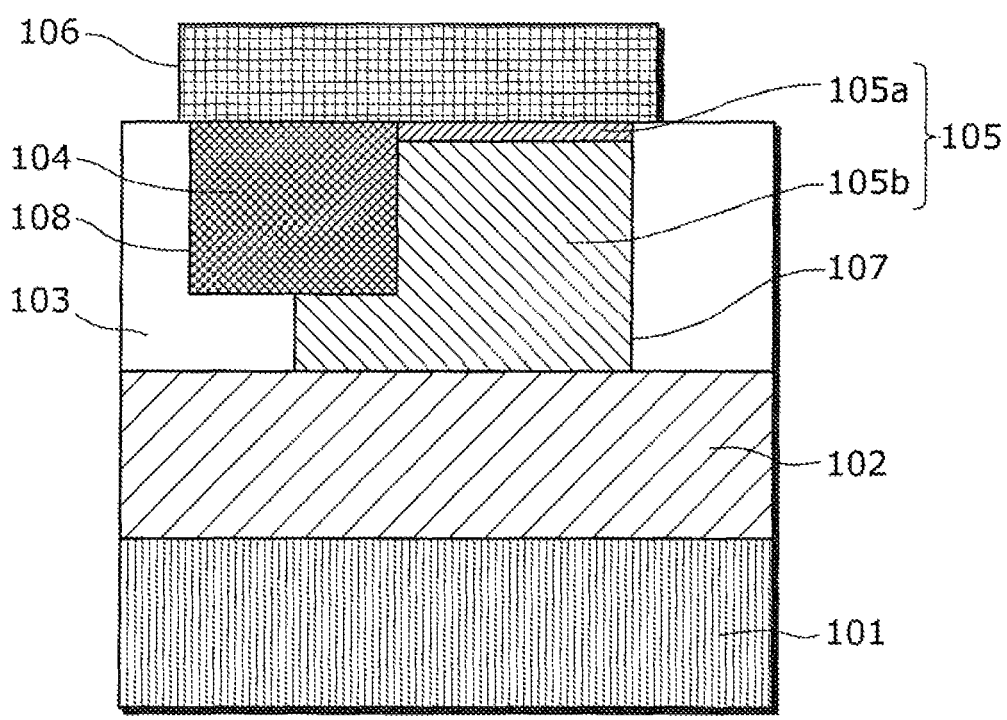
FIG. 16 is a cross-sectional view showing another modification of the nonvolatile memory element according to Embodiment 2 of the present invention.

It is to be noted that although the contact hole 108 is formed inside the contact hole 107 for forming the variable resistance layer 105 in order to form the fixed resistance layer 104 in the present embodiment (FIG. 14B(c)), the high resistance layer 105a and the fixed resistance layer 104 included in the variable resistance layer 105 can be formed adjacent to each other and connected in parallel as long as at least the fixed resistance layer 104 penetrates a part of the high resistance layer 105a of the variable resistance layer 105, and thus, for example, as shown in FIG. 16, the contact hole 108 for the fixed resistance layer 104 may protrude from the contact hole 107 for the variable resistance layer 105.

(Embodiment 3)

Next, a nonvolatile memory element according to Embodiment 3 of the present invention shall be described.

Figure 17A:
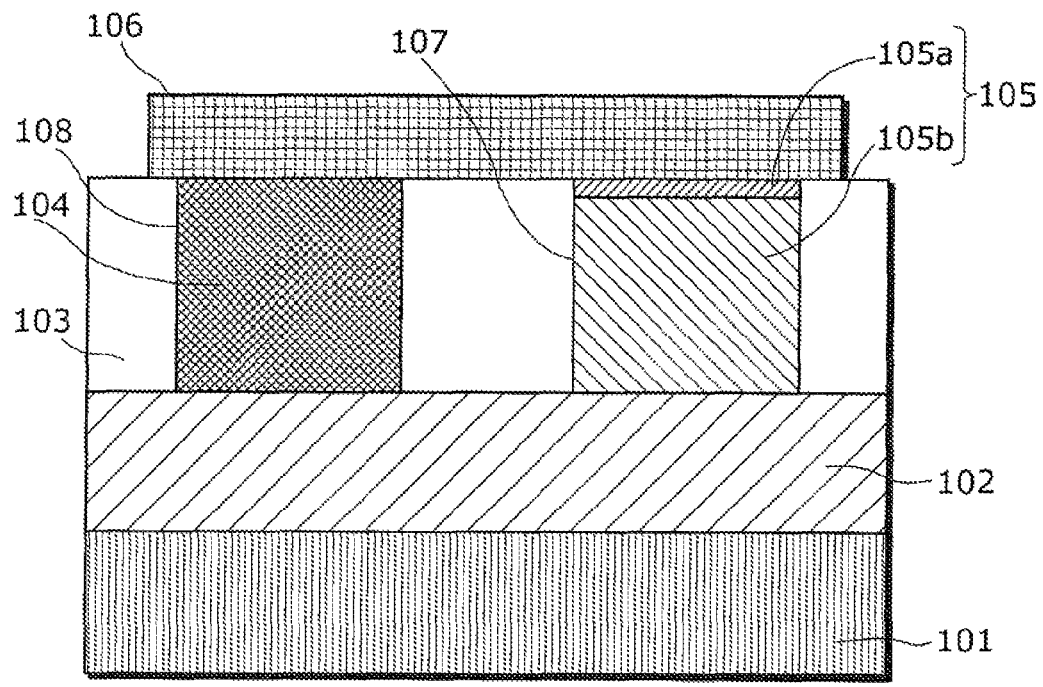
FIG. 17A is a cross-sectional view showing a nonvolatile memory element according to Embodiment 3 of the present invention.
Figure 17B:
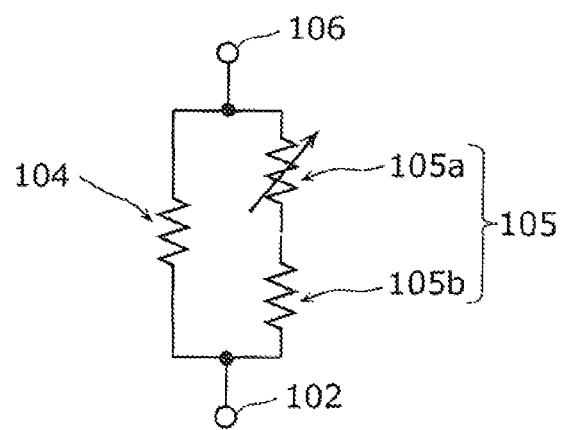
FIG. 17B is a diagram showing an equivalent circuit of the nonvolatile memory element according to Embodiment 3 of the present invention.

FIG. 17A shows a schematic cross-sectional view of a nonvolatile memory element itself according to Embodiment 3 of the present invention, and FIG. 17B shows an equivalent circuit of the nonvolatile memory element. In the nonvolatile memory element according to the present invention, a first electrode 102 (Pt) is formed on a substrate 101, and an interlayer insulating layer 103 (an insulating layer composed mainly of $SiO_2$, SiN, or SiC and having the thickness of 50 nm) including a barrier layer is formed on the first electrode 102. A contact hole 107 (the diameter of 130 nm) for a variable resistance layer 105 and a contact hole 108 (the diameter of 130 nm) for a fixed resistance layer 104 are formed through the interlayer insulating layer 103. The fixed resistance layer 104 ($TaO_z$) is filled inside the contact hole 108. The variable resistance layer 105 (stacked structure of $TaO_y$ (3 nm)/$TaO_x$ (47 nm)) is filled inside the contact hole 107. Further, a second electrode 106 (Pt) is formed in contact with both of the fixed resistance layer 104 and the variable resistance layer 105.

It is preferable that compositions x, y, and z of a Ta oxide used for the variable resistance layer 105 or the fixed resistance layer 104 have values which cause resistance values of the variable resistance layer 105 and the fixed resistance layer 104 to be in the same order. Consequently, a nearly equal electric field is applied to both of the variable resistance layer 105 and the fixed resistance layer 104. The variable resistance layer 105 has a stacked structure including the high resistance layer 105a ($TaO_y$) and the low resistance layer 105b ($TaO_x$), and thus most of an electric field is applied to the high resistance layer 105a, and a resistance change operation occurs when the electric field equal to or greater than a threshold value is applied. In contrast, a thickness of the fixed resistance layer $TaO_z$ in an electric field direction is 50 nm which is the depth of the contact hole 108, and thus only an electric field equal to or less than the threshold value is applied, and a resistance change does not occur.

The present embodiment differs from Embodiments 1 and 2 in that the fixed resistance layer 104 and the variable resistance layer 105 are not in contact with each other, and even when a difference in resistance value between the fixed resistance layer 104 and the variable resistance layer 105 is increased, the electric field can be evenly applied to each of the fixed resistance layer 104 and the variable resistance layer 105. Thus, an effect of parallel resistance can be expected more surely.

(Compositions and Resistivities of Fixed Resistance Layer and Variable Resistance Layer According to Embodiment 3)

When the fixed resistance layer 104 and the variable resistance layer 105 are respectively formed in the contact holes 107 and 108 each having the diameter of 2r and the depth of t, the following relationship holds for a resistance value of the fixed resistance layer.

$$R = \frac{\rho \cdot t}{\pi r^2} \quad \text{[Math. 5]}$$

Figure 18:
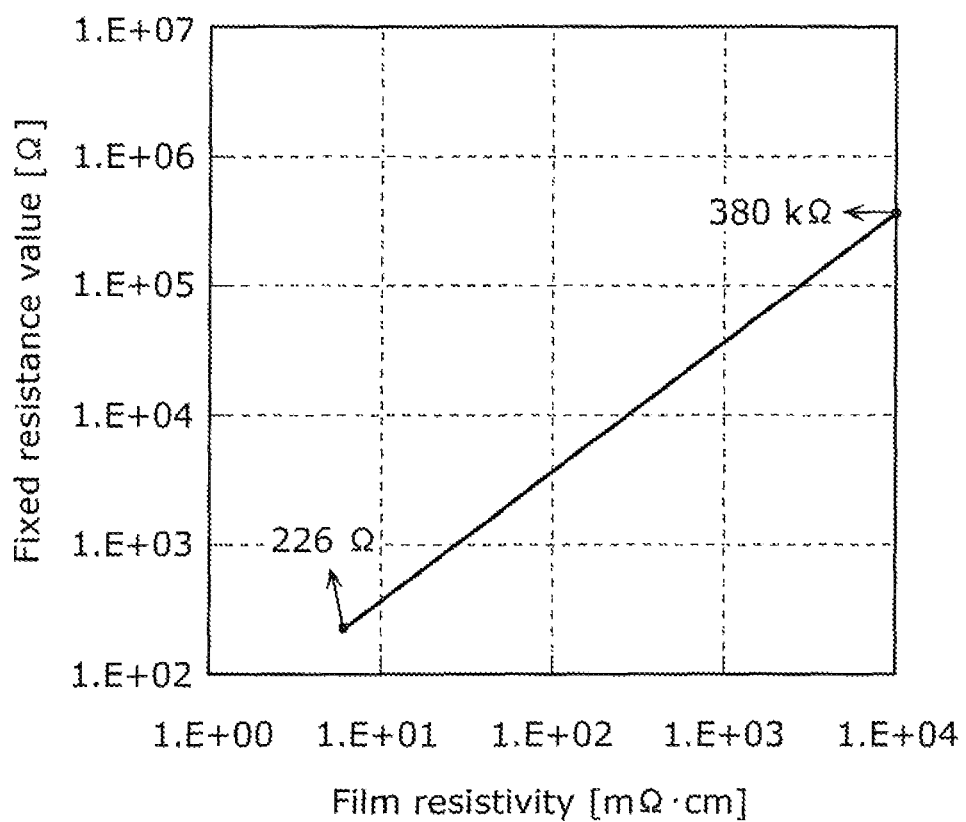
FIG. 18 is a diagram showing a relationship between a film resistivity and a fixed resistance value in the nonvolatile memory element according to Embodiment 3 of the present invention.

When a resistivity of the fixed resistance layer 104 is changed between 6 mΩcm and 10000 mΩcm, as shown in FIG. 18, it is possible to arbitrarily determine, within a range of 226Ω to 380 kΩ, a resistance value of the fixed resistance layer 104 which is to be obtained.

When the contact hole 108 has the diameter of 130 nm and the depth of 50 nm, the resistivity may be set to 2660 mΩcm in order to achieve a resistance value of about 100 kΩ.

When the resistivity of the fixed resistance layer 104 (TaO$_z$) is 2260 mΩcm, a value of the composition z is z=2.15.

(Manufacturing Method According to Embodiment 3)

Figure 19A:
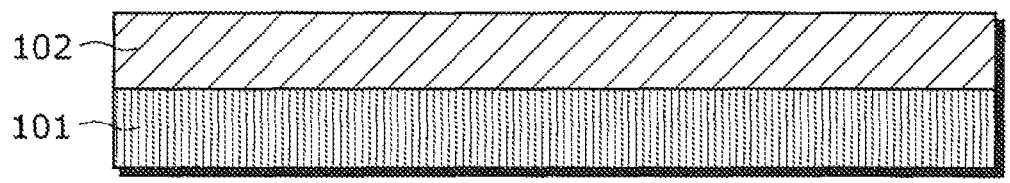
FIG. 19A(a) to FIG. 19A(d) are process charts showing a manufacturing method of the nonvolatile memory element according to Embodiment 3 of the present invention.
Figure 19A:
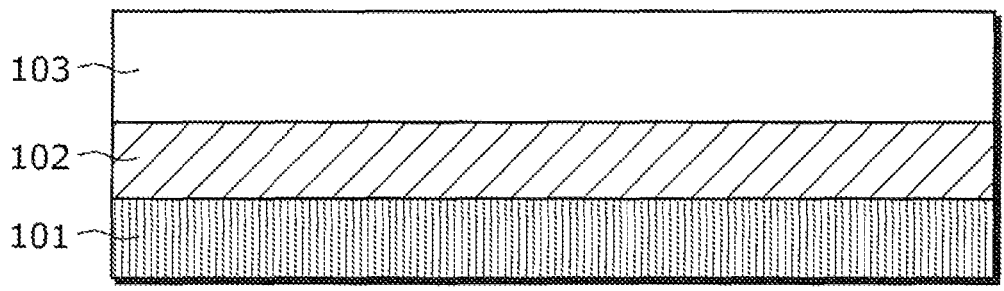
Figure 19A:
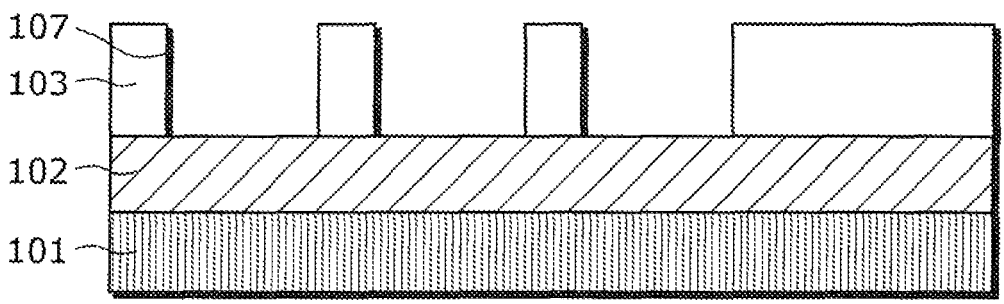
Figure 19A:
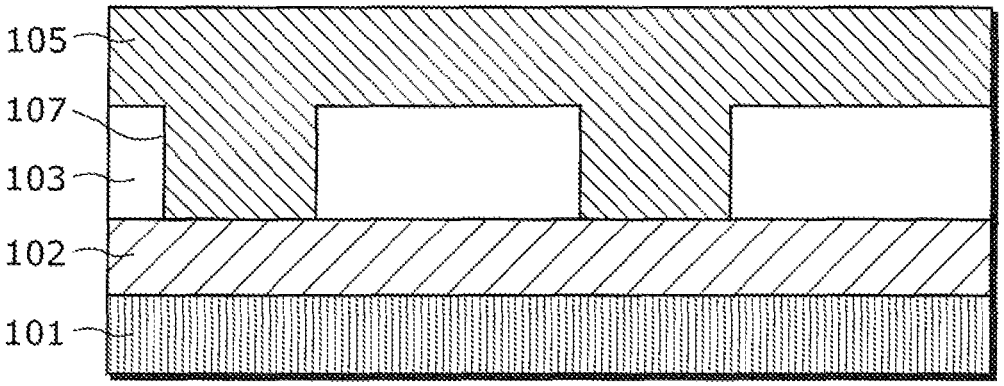

The following describes a manufacturing method of the nonvolatile memory element according to the present embodiment. FIG. 19A (a) to FIG. 19C (b) sequentially show a process flow of the nonvolatile memory element according to the present embodiment.

First, as shown in FIG. 19A(a), a plurality of first electrodes 102 each of which is made of Pt and has the wiring width of 300 nm and the thickness of 200 nm are formed on the substrate 101 so as to extend in a predetermined direction. Each first electrode 102 becomes a first wire. After a trench (ditch) for embedding a wire in an insulating layer is formed, the first electrode 102 (Pt) is formed by sputtering. Here, a damascene process in which the embedding is performed with the CMP (chemical mechanical polishing) technique may be used (not shown).

Next, as shown in FIG. 19A(b), after a barrier layer (SiN, SiC, and so on) is formed, an interlayer insulating layer (SiO$_2$) is deposited through, for instance, a CVD process, so as to be subsequently formed as the interlayer insulating layer 103 having the thickness of 50 nm, using the CMP technique.

Next, as shown in FIG. 19A(c), by a dry etching method, the contact hole 107 having the diameter of 130 nm is dug through the interlayer insulating layer 103 until the contact hole 107 reaches the first electrode 102.

Next, as shown in FIG. 19A(d), the variable resistance layer 105 made of TaO$_x$ is formed on the whole surface by sputtering.

Figure 19B:
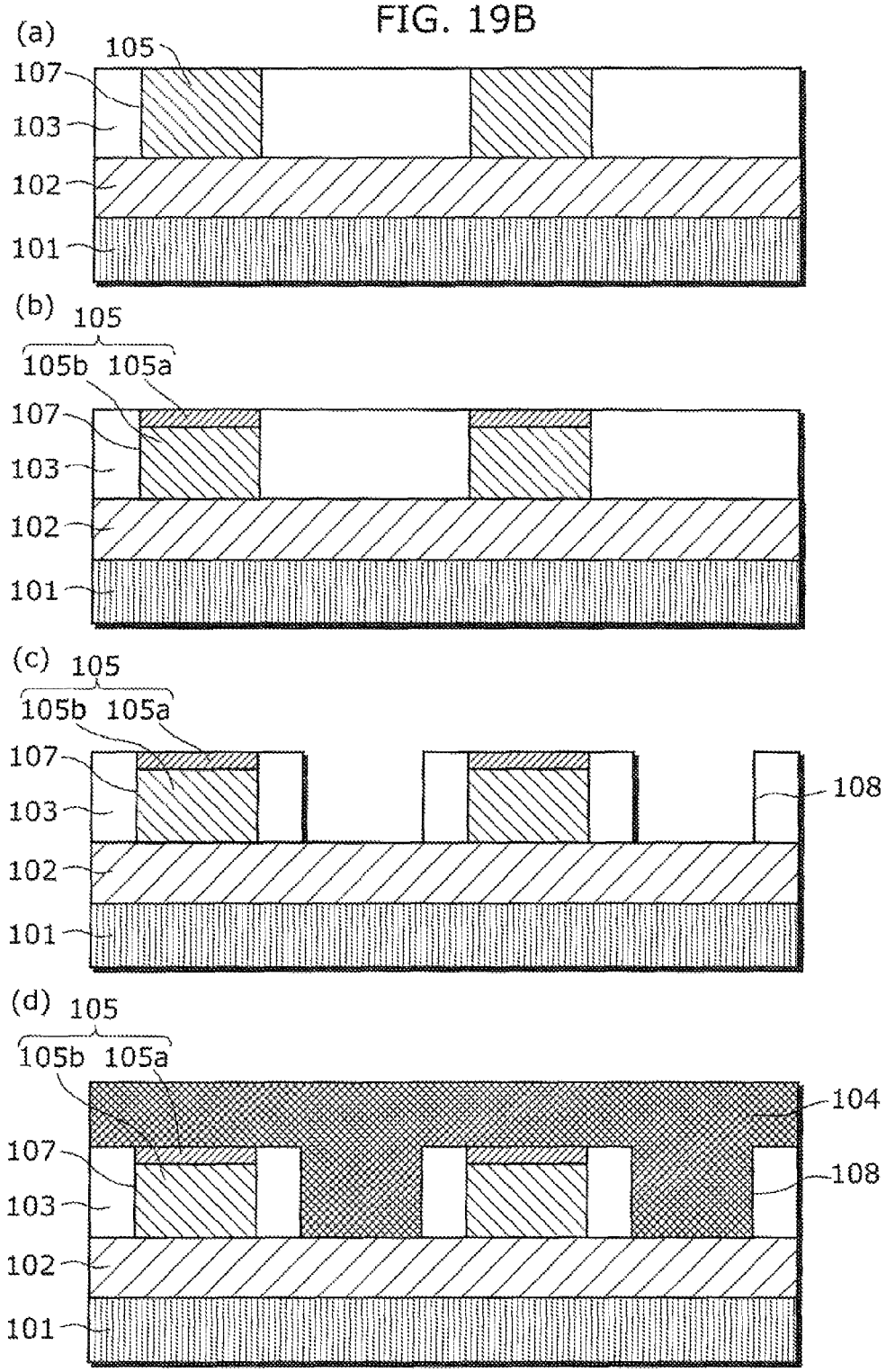
FIG. 19B(a) to FIG. 19B(d) are process charts showing the manufacturing method subsequent to FIG. 19A(d).

Next, as shown in FIG. 19B(a), the variable resistance layer 105 which is deposited on the interlayer insulating layer 103 is polished with the CMP technique so that the variable resistance layer 105 remains only inside the contact hole 107.

Subsequently, as shown in FIG. 19B(b), the surface of the variable resistance layer 105 is oxidized by oxygen plasma treatment (e.g., 200 W for 4 sec at room temperature), so as to form the high resistance layer 105a having the thickness of 5 nm. The unoxidized variable resistance layer 105 having the thickness of remaining 45 nm becomes the low resistance layer 105b.

Next, as shown in FIG. 19B(c), by the dry etching method, the contact hole 108 having the diameter of 130 nm is dug by the side of the contact hole 107 through the interlayer insulating layer 103 until the contact hole 108 reaches the first electrode 102.

Next, as shown in FIG. 19B(d), the fixed resistance layer 104 made of TaO$_z$ is formed on the whole surface by the sputtering.

Figure 19C:
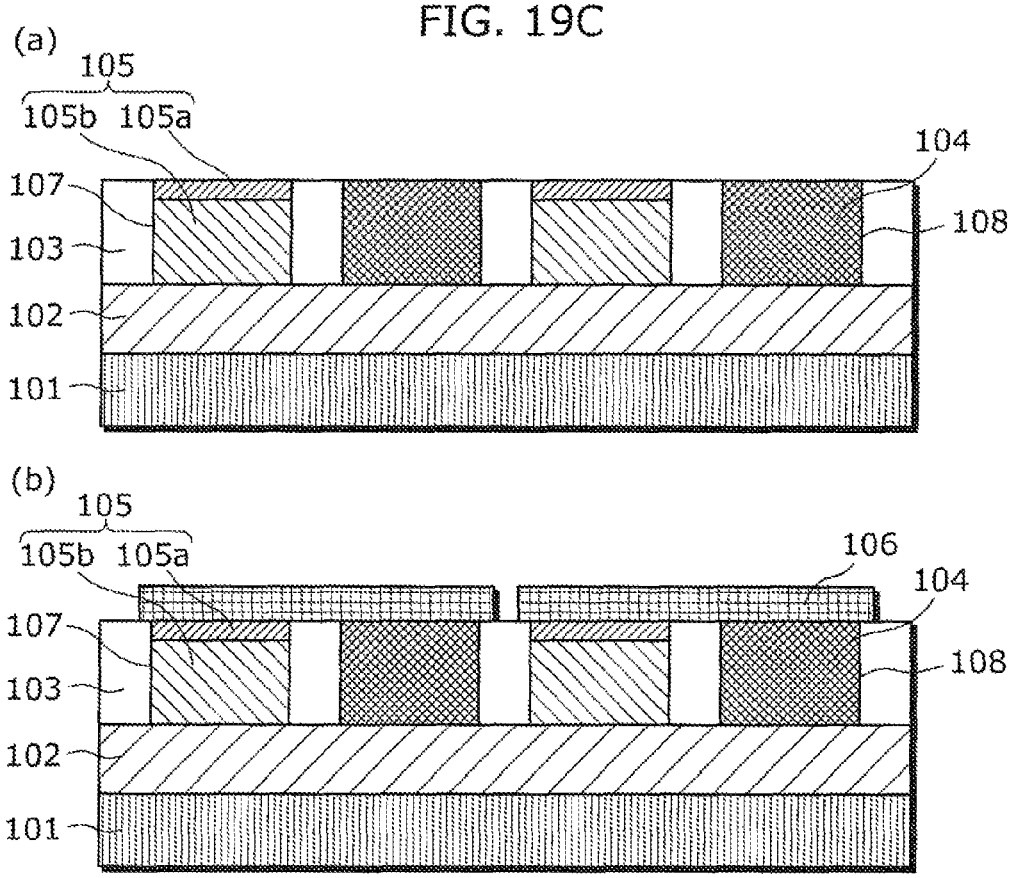
FIG. 19C(a) and FIG. 19C(b) are process charts showing the manufacturing method subsequent to FIG. 19B(d).

Next, as shown in FIG. 19C(a), the fixed resistance layer 104 which is deposited on the interlayer insulating layer 103 and the variable resistance layer 105 is polished with the CMP technique so that the fixed resistance layer 104 remains only inside the contact hole 108.

Lastly, as shown in FIG. 19C(b), a plurality of second electrodes 106 each of which is made of Pt and has the wiring width of 300 nm and the thickness of 200 nm are formed so as to extend in a predetermined direction. Each second electrode 106 is formed to cover a corresponding one of the contact holes 107 and cross the first wire, which is the first electrode 102, and becomes a second wire.

It is to be noted that, like the first electrode 102, after a trench for embedding a wire in the interlayer insulating layer 103 is formed, the second wire 106 (Pt) is formed by the sputtering. Here, a damascene process in which the embedding is performed with the CMP technique can be also used.

Furthermore, although the first electrode 102 and the second electrode 106 which are in direct contact with the nonvolatile memory element are made of Pt in the present embodiment, each of the first electrode 102 and the second electrode 106 may be made of another electrode material such as Ta and a Ta compound, a rare metal material such as Cu, Au, Ir, Pd, Ru, and Rh, and a compound of these rare metal materials.

Moreover, each of the first electrode 102 and the second electrode 106 may be made of a metal material generally used for semiconductor, for example, an Al-system wiring material such as W, Ti, TiN, and AlCu. Furthermore, the substrate can be formed using a material other than Si in the present embodiment.

Further, although the fixed resistance layer 104 is made of TaO$_z$, the fixed resistance layer 104 may be made of a material having a desired resistivity such as TaON and Ta$_3$N$_{(5-x)}$. For instance, when the fixed resistance layer 104 is made of a material which does not easily cause a resistance change such as TaON and Ta$_3$N$_{(5-x)}$, it is necessary to give little thought about the thickness of the fixed resistance layer 104, and to satisfy only conditions for a desired resistance value.

(Embodiment 4)

Next, a nonvolatile memory element according to Embodiment 4 of the present invention shall be described.

Embodiment 4 of the present invention provides a structure in which nonvolatile memory elements including any one of the nonvolatile memory elements described in Embodiment 1 or 3 are arranged in a two-dimensional array in a plane.

Figure 20:
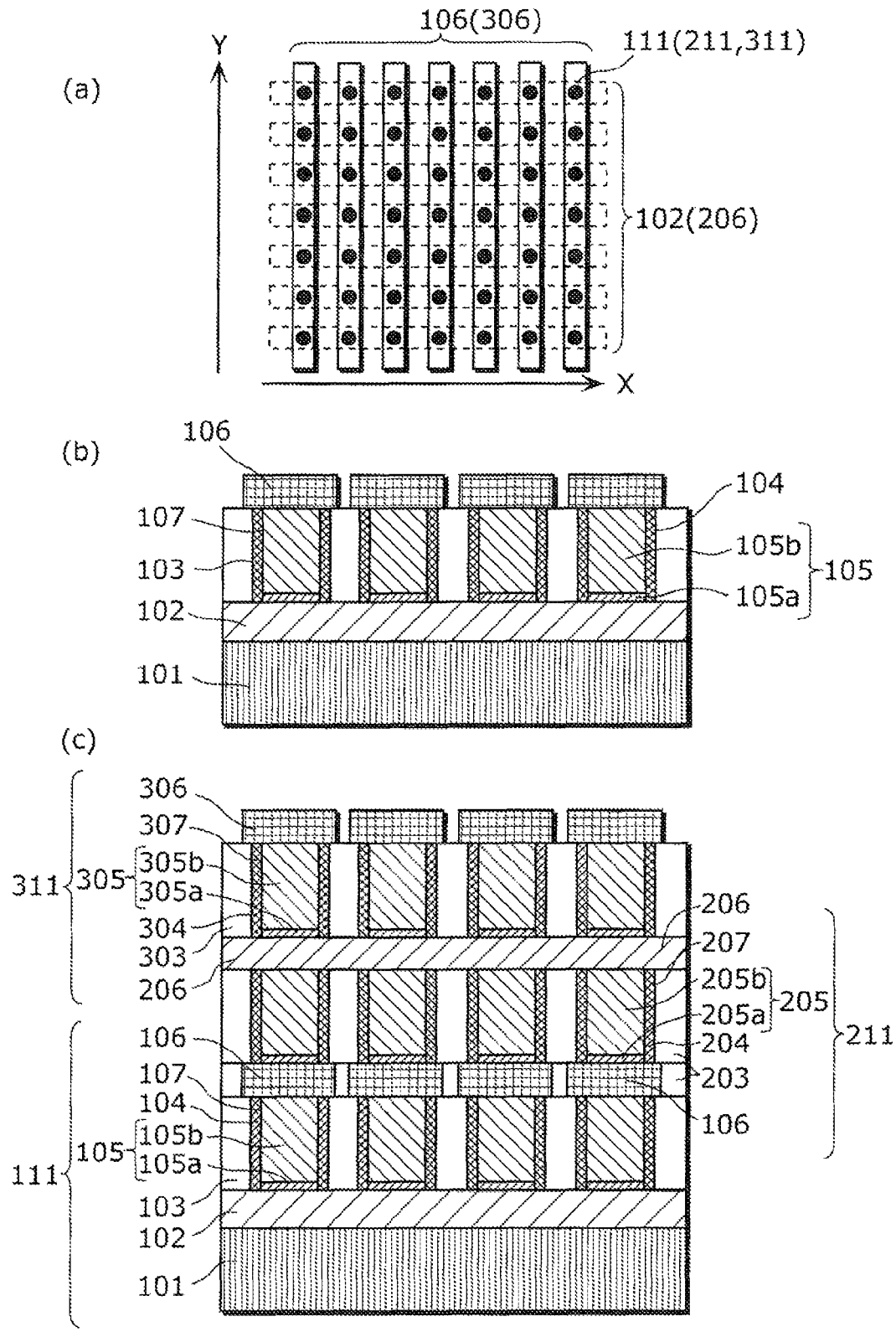
FIG. 20($a$) is a plan view of nonvolatile memory elements according to Embodiment 4 of the present invention, FIG. 20($b$) is a cross-sectional view when the nonvolatile memory elements are formed in one layer, and FIG. 20($c$) is a cross-sectional view when the nonvolatile memory elements are formed in three layers.

FIG. 20(a) and FIG. 20(b) are a plan view and a cross-sectional view showing the present embodiment in which the nonvolatile memory element described in Embodiment 1 is used, respectively.

As shown in FIG. 20(a), in the nonvolatile memory element array, first wires 102 (Pt) are formed parallel to each other on a substrate 101 so as to extend in a predetermined direction X. Interlayer insulating layers 103 (insulating layers composed mainly of SiO$_2$, SiN, or SiC and having the thickness of 50 nm) are formed on each of the first wires 102. Second wires 106 (Pt) are formed parallel to each other on the interlayer insulating layers 103 so as to extend in a predetermined direction Y which crosses the extension direction X of the first wires 102. A contact hole 107 is formed in each of the interlayer insulating layers at a region where corresponding ones of the first wires 102 and the second wires 106 cross with each other. A fixed resistance layer 104 and a variable resistance layer 105 are provided inside the contact hole 107 so as to form a nonvolatile memory element 111.

It is to be noted that although, in FIG. 20(a) and FIG. 20(b), the nonvolatile memory element 111 corresponds to the nonvolatile memory element according to Embodiment 1, the nonvolatile memory element 111 may correspond to any one of the nonvolatile memory elements described in Embodiment 1 or 3.

With the above structure, it is possible to realize a crosspoint nonvolatile memory device having a large capacity by arranging the nonvolatile memory element 111 in a two-dimensional array as in the present embodiment.

It is to be noted that not a single-layer array structure but a multilayer array structure can be formed as shown in FIG. 20(c) in the present embodiment. In the case of the multilayer array structure, connection contact with peripheral circuitry is individually formed in each layer (not shown) so as to form a multilayer having the same number of memories as a plane, and thus it is possible to reduce a chip area. In the multilayer (three-layer in FIG. 20(c)) nonvolatile memory element array according to the present embodiment shown in FIG. 20(c), a nonvolatile memory element array 111 shown in FIG. 20(a) is formed on the substrate 101 as the first layer. Next, a nonvolatile memory element array 211 is formed as the second layer, and the second wires 106 of the first-layer nonvolatile memory element array 111 serve as first wires of the second-layer nonvolatile memory element array 211. Interlayer insulating layers 203 (insulating layers composed mainly of $SiO_2$, SiN, or SiC and having the thickness of 50 nm) are formed on the second wires 106 formed parallel to each other and extending in the predetermined direction Y. Third wires 206 (Pt) are formed parallel to each other so as to extend in the predetermined direction X which crosses the extension direction Y of the second wires 106. A contact hole 207 for forming the second-layer nonvolatile memory element array 211 is formed in a corresponding one of the interlayer insulating layers 203 at a region where corresponding ones of the second wires 106 and the third wires 206 cross with each other. A variable resistance layer 205 (a high resistance layer 205a, a low resistance layer 205b) and a fixed resistance layer 204 are provided inside the contact hole 207 of the second layer so as to form a nonvolatile memory element 211.

Although, in FIG. 20(c), the nonvolatile memory element 211 corresponds to the nonvolatile memory element according to Embodiment 1, the nonvolatile memory element 211 may correspond to any one of the nonvolatile memory elements described in Embodiment 1 or 3.

Also in a third-layer nonvolatile memory element array 311, the third wires 206 serve as first wires of the third-layer nonvolatile memory element array. Interlayer insulating layers 303 (insulating layers composed mainly of $SiO_2$, SiN, or SiC and having the thickness of 50 nm) are formed on the third wires 206 formed parallel to each other so as to extend in the predetermined direction X. Fourth wires 306 (Pt) are formed parallel to each other so as to extend in the predetermined direction Y which crosses the extension direction X of the third wires 206. A contact hole 307 for forming the third-layer nonvolatile memory element array 311 is formed in a corresponding one of the interlayer insulating layers 303 at a region where corresponding ones of the third wires 206 and the fourth wires (second electrodes) 306 cross with each other. A variable resistance layer 305 (a high resistance layer 305a, a low resistance layer 305b) and a fixed resistance layer 304 are provided inside the contact hole 307 of the third layer so as to form a nonvolatile memory element 311.

Although, in FIG. 20(c), the nonvolatile memory element 311 corresponds to the nonvolatile memory element according to Embodiment 1, the nonvolatile memory element 311 may correspond to any one of the nonvolatile memory elements described in Embodiment 1 or 3.

Although the three-layer nonvolatile memory element array according to the present embodiment has been described above, a further multilayer structure can be formed by repeating the same three-layer structure, and it is possible to realize a nonvolatile memory element having a large capacity.

It is to be noted that each of the wires 102, 106, and 206 serves as the first electrode and each of the wires 106, 206, and 306 serves as the second electrode, and thus the first and second electrodes are omitted from the structure. However, there is a possibility that an unstable resistance change operation or deterioration of elements occurs depending on compatibility between a variable resistance layer or fixed resistance layer and an electrode, and a wiring material. In this case, the second electrode may be placed between the variable resistance layer and the fixed resistance layer, and the first wire or between the variable resistance layer and the fixed resistance layer, and the second electrode.

Figure 21A:
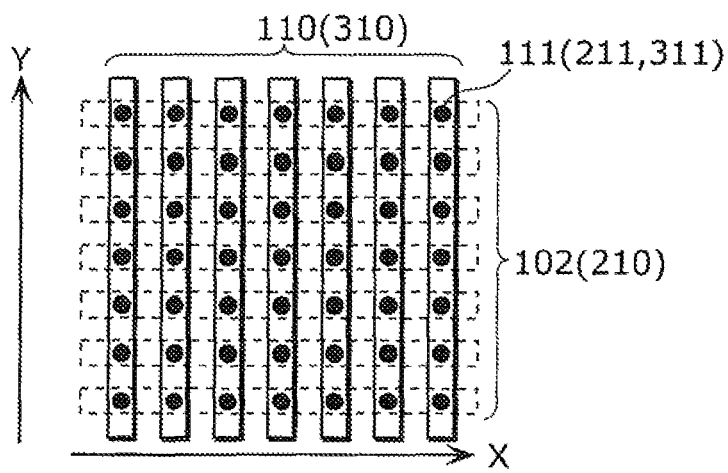
FIG. 21A(a) is a plan view of a modification of the nonvolatile memory elements according to Embodiment 4 of the present invention, FIG. 21A(b) is a cross-sectional view when the nonvolatile memory elements are formed in one layer, and FIG. 21A(c) is a cross-sectional view when the nonvolatile memory elements are formed in three layers.
Figure 21A:
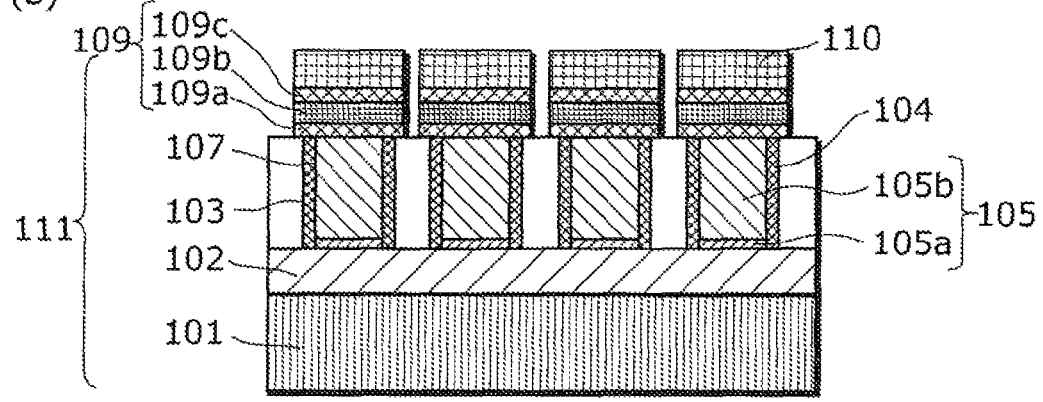
Figure 21A:
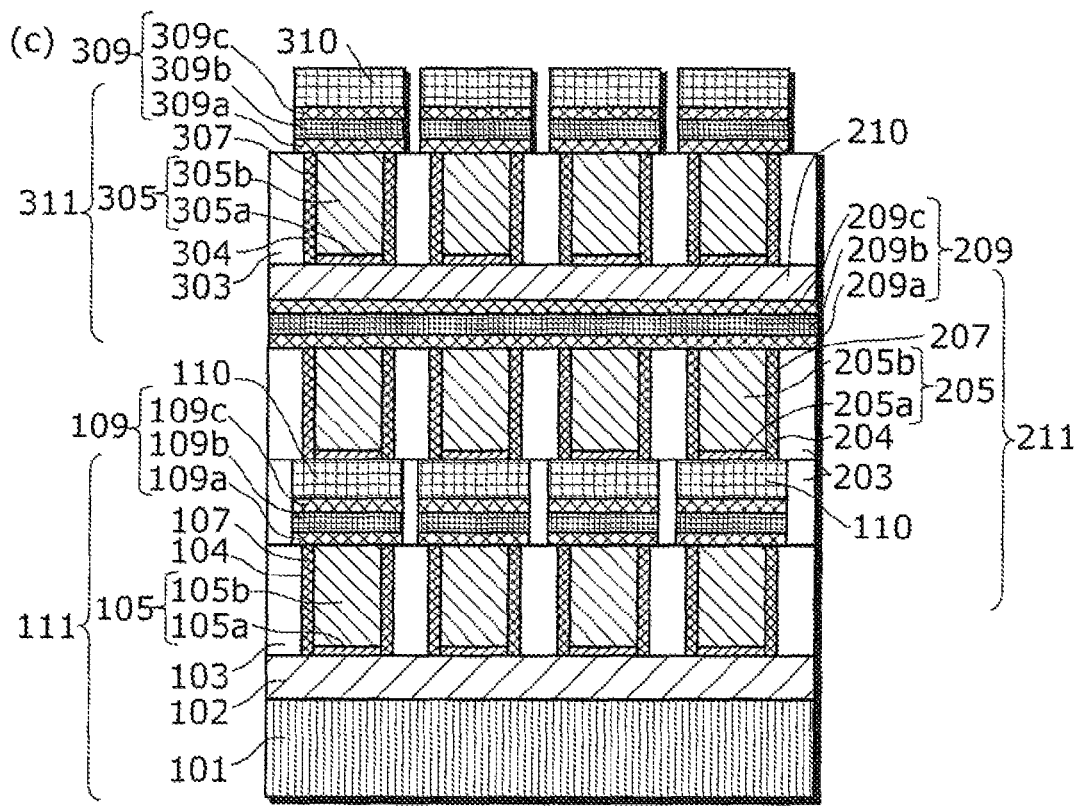
Figure 21B:
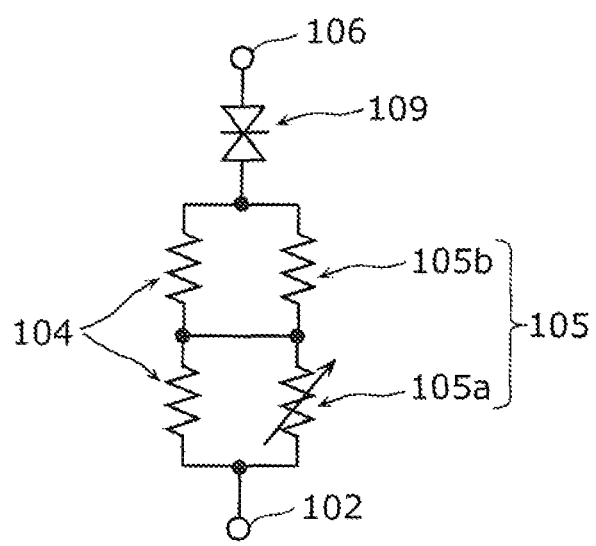
FIG. 21B is a diagram showing an equivalent circuit of each nonvolatile memory element according to Embodiment 4 of the present invention.

Further, a rectifying device such as, as shown in FIG. 21A(a) and FIG. 21A(b), an MSM diode element 109 (TaN (109c)/$SiN_x$ (109b)/TaN (109a)) may be formed between the first wire and the first electrode or between the second electrode and the second wire. It is to be noted that FIG. 21A(a) is a plan view of a modification of the nonvolatile memory elements according to Embodiment 4 of the present invention, and FIG. 21A(b) is a cross-sectional view when the nonvolatile memory elements are formed in one layer. As shown by the cross-sectional view of FIG. 21A(b), the first wire 102 serves as the first electrode, a lower electrode 109a of the MSM diode element 109 serves as the second electrode, and an upper electrode 109c of the MSM diode element 109 is connected to a second wire 110. In such a structure, an equivalent circuit of one memory cell is as shown in FIG. 21B. In other words, the equivalent circuit is the circuit according to Embodiment 1 which is shown in FIG. 7B and to which a bidirectional diode is connected in series.

It is to be noted that in the case of the multilayer structure as shown in FIG. 21A(c), the second wire 110 serves as the first electrode of the nonvolatile memory element 211, a lower electrode 209a of an MSM diode element 209 serves as the second electrode, and an upper electrode 209c of the MSM diode element 209 is connected to a third wire 210. Moreover, the third wire 210 serves as the first electrode of the nonvolatile memory element 311, a lower electrode 309a of an MSM diode element 309 (lower electrode 309a, semiconductor layer 309b, upper electrode 309c) serves as the second electrode, and the upper electrode 309c of the MSM diode element 309 is connected to a fourth wire 310.

Although the MSM diode element is placed between the second electrode and the second wire in FIG. 21A(a) to FIG. 21A(c), the MSM diode element may be placed between the first wire and the first electrode.

(Embodiment 5)

Next, a nonvolatile memory element according to Embodiment 5 of the present invention shall be described.

In the present embodiment, a nonvolatile memory device includes any one of the nonvolatile memory elements described in Embodiment 1 or 3, and is a 1 transitor/1 nonvolatile memory device.

Figure 22:
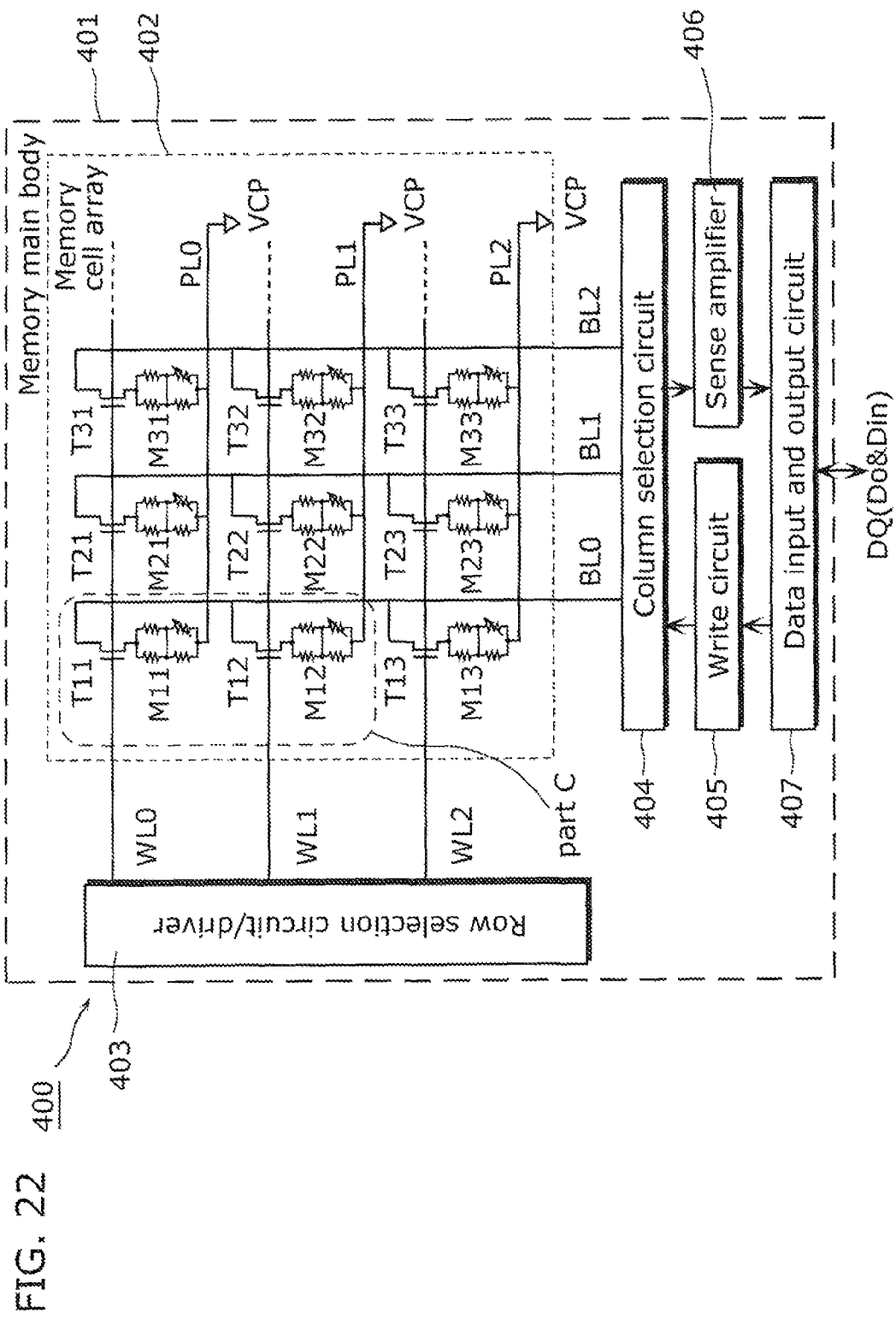
FIG. 22 is a block diagram showing a structure of a nonvolatile memory element according to Embodiment 5 of the present invention.
Figure 23:
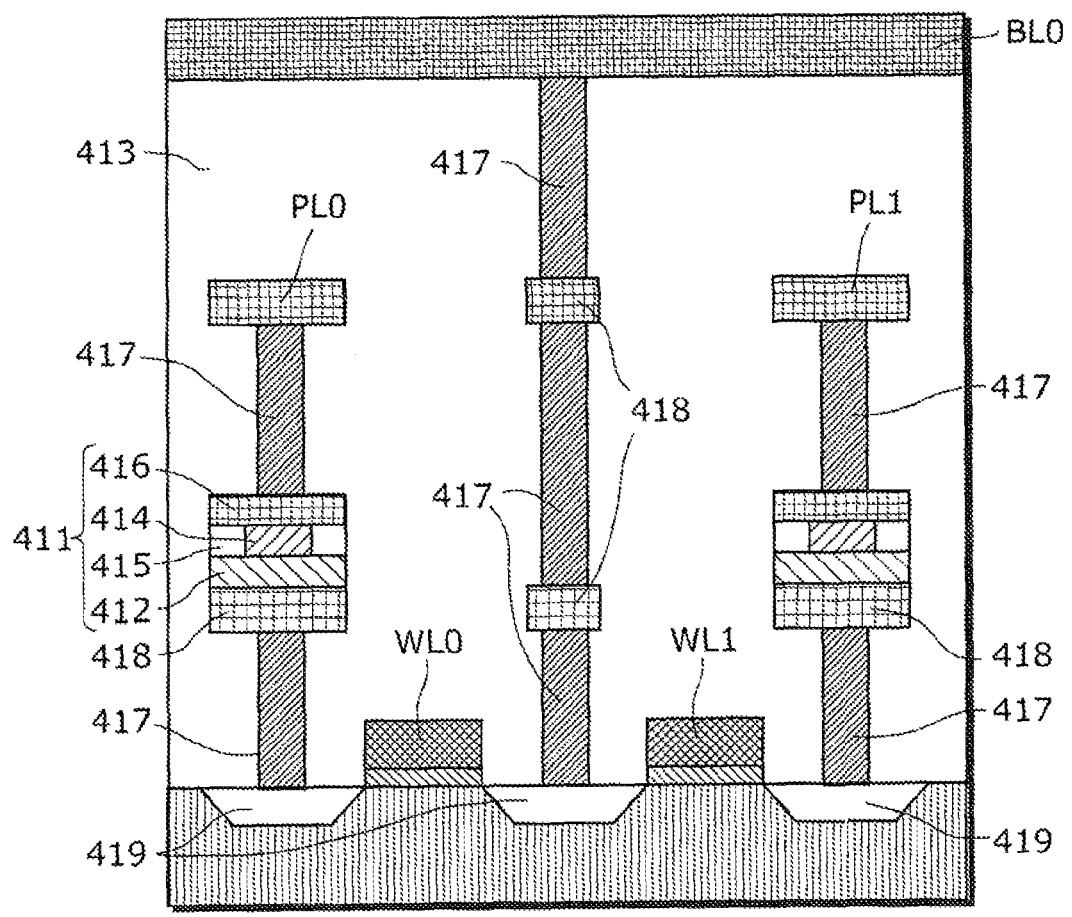
FIG. 23 is a cross-sectional view showing a structure of part C (structure for two bits) shown in FIG. 22.

FIG. 22 is a block diagram showing a structure of a nonvolatile memory element 400 according to Embodiment 5 of the present invention. FIG. 23 is a cross-sectional view showing a structure of part C (structure for two bits) shown in FIG. 22. Although, in FIG. 23, a nonvolatile memory element 411 corresponds to the nonvolatile memory element according to Embodiment 1, the nonvolatile memory element 411 may correspond to any one of the nonvolatile memory elements described in Embodiment 1 or 3.

The nonvolatile memory device 400 is a device which stores data into nonvolatile memory elements, and includes: a memory cell array 402 in which memory cells each of which includes any one of the nonvolatile memory elements described in Embodiments 1 to 3 are two-dimensionally arranged; a selection circuit (row selection circuit/driver 403, column selection circuit 404) which selects at least one memory cell from the memory cell array 402; a write circuit 405 which changes, to a high resistance state or a low resistance state, a resistance state of a nonvolatile memory element included in the selected memory cell; a sense amplifier 406 which determines whether the nonvolatile memory element is in the high resistance state or the low resistance state; and the like.

More specifically, as shown in FIG. 22, the nonvolatile memory device 400 according to the present embodiment includes a memory main body 401 on a semiconductor substrate, and the memory main body 401 includes: the memory cell array 402; the row selection circuit/driver 403; the column selection circuit 404; the write circuit 405 for writing data; the sense amplifier 406 which detects an amount of current flowing in a selected bit line and determines whether the data indicates "1" or "0"; and a data input and output circuit 407 which performs input and output processing of input and output data via a terminal DQ.

The memory cell array 402 includes: word lines WL0, WL1, WL2, . . . and bit lines BL0, BL1, BL2, . . . which are formed on the semiconductor substrate and arranged to cross with each other; transistors T11, T12, T13, T21, T22, T23, T31, T32, T33, . . . (hereinafter, referred to as "transistors T11, T12, . . . ") each of which is provided to correspond to a corresponding one of crosspoints of the word lines WL0, WL1, WL2, . . . and the bit lines BL0, BL1, BL2, . . . ; and memory cells M11, M12, M13, M21, M22, M23, M31, M32, and M33 (hereinafter, referred to as "memory cells M11, M12, . . . ") each of which is provided to correspond to the transistors T11, T12, . . . on a one-on-one basis.

In addition, the memory cell array 402 includes plate lines PL0, PL1, PL2, . . . which are arranged parallel to the word lines WL0, WL1, WL2, . . . .

As shown in FIG. 23, the bit line BL0 is arranged above the word lines WL0 and WL1, and the plate lines PL0 and PL1 are arranged between the word lines WL0 and WL1, and the bit line BL0.

Here, the nonvolatile memory element 411 shown in FIG. 23 corresponds to each of the memory cells M11, M12, . . . , and includes: a first electrode 412; a second electrode 416; a variable resistance layer 415 which is placed between the first electrode 412 and the second electrode 416 and whose resistance value reversibly changes based on an electrical signal applied between the first electrode 412 and the second electrode 416; and a fixed resistance layer 414 which is placed between the first electrode 412 and the second electrode 416 and electrically connected in parallel to at least a part of the variable resistance layer 415. FIG. 23 also shows an interlayer insulating layer 413, a plug layer 417, a metal wiring layer 418, and a source/drain region 419.

As shown in FIG. 22, drains of the transistors T11, T12, T13, . . . , drains of the transistors T21, T22, T23, . . . , and drains of the transistors T31, T32, T33, . . . are connected to the bit line BL0, the bit line BL1, and the bit line BL2, respectively.

Moreover, gates of the transistors T11, T21, T31, . . . , gates of the transistors T12, T22, T32, . . . , and gates of the transistors T13, T23, T33, . . . are connected to the word line WL0, the word line WL1, and the word line WL2, respectively.

Furthermore, each of sources of the transistors T11, T12, . . . is connected to a corresponding one of the memory cells M11, M12, . . . .

Moreover, the memory cells M11, M21, M31, . . . , the memory cells M12, M22, M32, . . . , and the memory cells M13, M23, M33, . . . are connected to the plate line PL0, the plate line PL1, and the plate line PL2, respectively.

The following describes operations of the nonvolatile memory device 400. Address signals are received from an external circuit (not shown). Row address signals are outputted to the row selection circuit/driver 403 based on the address signals, and column address signals are outputted to the column selection circuit 404. Here, the address signals are signals indicating an address of a specific memory cell to be selected from among the memory cells M11, M12, . . . . Furthermore, the row address signals are signals indicating an address of a row which is a part of the address indicated by the address signals, and the column address signals are signals indicating an address of a column which is a part of the address indicated by the address signals.

In a data write cycle, a write command signal instructing application of a voltage for writing is outputted to the write circuit 405 as a control signal (not shown) inputted from the outside, according to input data Din inputted to the data input and output circuit 407. On the other hand, in a data read cycle, a read command signal instructing application of a voltage for reading is outputted to the column selection circuit 404 as the control signal.

The row selection circuit/driver 403 receives the row address signals outputted based on the address signals, selects one of the word lines WL0, WL1, and WL2 according to the row address signals, and applies a predetermined voltage to the selected word line.

The column selection circuit 404 receives the column address signals outputted based on the address signals, selects one of the bit lines BL0, BL1, and BL2 according to the column address signals, and applies the voltage for writing or the voltage for reading to the selected bit line.

When the control signal is the write command signal, the write circuit 405 outputs, to the column selection circuit 404, the signal instructing the application of the voltage for writing to the selected bit line.

In the data read cycle, the sense amplifier 406 detects an amount of current flowing in the selected bit line to be read, and determines whether data indicates "1" or "0". The resultant output data Do is outputted to the external circuit via the data input and output circuit 407.

As described above, the present invention is also realized as the nonvolatile memory device having the memory cell array including the nonvolatile memory element according to the present invention.

INDUSTRIAL APPLICABILITY

The present invention is useful as a nonvolatile memory element whose resistance value reversibly changes based on an electrical signal and a nonvolatile memory device including the nonvolatile memory element, especially as a large-capacity nonvolatile memory device which achieves high speed and high integration, and; for example, as a memory contributing to speeding up and miniaturization of electronic devices such as mobile information devices and home information appliances.

REFERENCE SIGNS LIST

101 Substrate
102 First electrode (First wire)
103 Interlayer insulating layer
104 Fixed resistance layer
105 Variable resistance layer
105a High resistance layer of variable resistance layer
105b Low resistance layer of variable resistance layer
106 Second electrode (Second wire)
107 Contact hole
108 Contact hole
109 Diode element
109a Diode lower electrode
109b Diode semiconductor layer
109c Diode upper electrode
110 Second wire
111 Nonvolatile memory element (array)
203 Interlayer insulating layer
204 Fixed resistance layer
205 Variable resistance layer
205a High resistance layer of variable resistance layer
205b Low resistance layer of variable resistance layer
206 Second electrode (Third wire)
207 Contact hole
209 Diode element
209a Diode lower electrode
209b Diode semiconductor layer
209c Diode upper electrode
210 Third wire
211 Nonvolatile memory element (array)
303 interlayer insulating layer
304 Fixed resistance layer
305 Variable resistance layer
305a High resistance layer of variable resistance layer
305b Low resistance layer of variable resistance layer
306 Second electrode (Fourth wire)
307 Contact hole
309 Diode element
309a Diode lower electrode
309b Diode semiconductor layer
309c Diode upper electrode
310 Fourth wire
311 Nonvolatile memory element (array)
400 Nonvolatile memory device
401 Memory main body
402 Memory cell array
403 Row selection circuit/driver
404 Column selection circuit
405 Write circuit
406 Sense amplifier
407 Data input and output circuit
411 Nonvolatile memory element (array)
412 First electrode
413 Interlayer insulating layer
414 Fixed resistance layer
415 Variable resistance layer
416 Second electrode
417 Plug layer
418 Metal wiring layer
419 Source/drain region of transistor
BL0, BL1, ... Bit line
M11, M12, ... Memory cell
T11, T12, ... Transistor
WL0, WL1, ... Word line

The invention claimed is:

1. A nonvolatile memory element comprising:
a first electrode;
a second electrode;
a variable resistance layer which is formed between said first electrode and said second electrode and is connected to said first electrode and said second electrode, and which reversibly changes between a high resistance state and a low resistance state according to a polarity of a voltage applied between said first electrode and said second electrode; and
a fixed resistance layer which has a resistance value that is 0.1 to 10 times as large as a resistance value of said variable resistance layer in the high resistance state, said fixed resistance layer being formed between said first electrode and said second electrode and being electrically connected in parallel to at least a part of said variable resistance layer.

2. The nonvolatile memory element according to claim 1, wherein the resistance value of said fixed resistance layer is 0.5 to 2 times as large as the resistance value of said variable resistance layer in the high resistance state.

3. The nonvolatile memory element according to claim 1, wherein the resistance value of said fixed resistance layer is equal to the resistance value of said variable resistance layer in the high resistance state.

4. The nonvolatile memory element according to claim 1, wherein said variable resistance layer has a stacked structure including at least a high resistance layer and a low resistance layer, and
wherein at least a part of said fixed resistance layer is electrically connected in parallel to said high resistance layer.

5. The nonvolatile memory element according to claim 4, wherein said high resistance layer is connected to said first electrode,
wherein said low resistance layer is connected to said second electrode, and
wherein said fixed resistance layer is electrically connected to said first electrode.

6. The nonvolatile memory element according to claim 4, wherein said fixed resistance layer is in contact with said high resistance layer.

7. The nonvolatile memory element according to claim 1, wherein said fixed resistance layer is electrically connected to said first electrode and said second electrode.

8. The nonvolatile memory element according to claim 1, further comprising
an interlayer insulating layer which is formed to fill a space between said first electrode and said second electrode,
wherein said variable resistance layer and said fixed resistance layer are formed in an opening that is a through-hole formed in said interlayer insulating layer.

9. The nonvolatile memory element according to claim 8, wherein said fixed resistance layer is formed to completely cover around at least a part of an inner wall of the opening, and
wherein said variable resistance layer is formed to fill a space which is inside of the opening and surrounded by said fixed resistance layer.

10. The nonvolatile memory element according to claim 8, wherein said variable resistance layer is formed to completely cover the inner wall of the opening, and wherein said fixed resistance layer is formed to fill a space surrounded by said variable resistance layer.

11. The nonvolatile memory element according to claim 8, wherein a plurality of openings including the opening are formed in said interlayer insulating layer,
wherein said variable resistance layer is formed to fill one of the openings, and
wherein said fixed resistance layer is formed to fill another one of the openings.

12. A nonvolatile memory device which stores data into a plurality of nonvolatile memory elements, said nonvolatile memory device comprising:
a memory cell array in which a plurality of memory cells are two-dimensionally arranged, each of said memory cells including the nonvolatile memory element according to claim 1;
a selection circuit which selects at least one memory cell from said memory cell array;
a write circuit which causes the nonvolatile memory element in said selected memory cell to change to one of a high resistance state and a low resistance state; and
a sense amplifier which determines whether the nonvolatile memory element in said selected memory cell is in the high resistance state or the low resistance state.

13. The nonvolatile memory device according to claim 12, wherein said memory cell is a circuit in which the nonvolatile memory element and a rectifying device are connected in series.

14. The nonvolatile memory device according to claim 12, wherein said memory cell is a circuit in which the nonvolatile memory element and a transistor are connected in series.

15. The nonvolatile memory device according to claim 12, wherein said memory cell array is a multilayered memory cell array formed by stacking in layers a plurality of memory cells that are two-dimensionally arranged.

16. The nonvolatile memory element according to claim 1, wherein when a current flows between said first electrode and said second electrode, the current is divided, and part of the current flows through said fixed resistance layer.

17. The nonvolatile memory element according to claim 16, wherein when a voltage for changing said variable resistance layer between the high resistance state and the low resistance state is applied between said first electrode and said second electrode, a part of a current flows through said fixed resistance layer.

18. The nonvolatile memory element according to claim 1, wherein said fixed resistance layer has a resistivity of at least 6 mΩ·cm and at most 10000 mΩ·cm.

19. The nonvolatile memory element according to claim 1, wherein said first electrode and said second electrode are a pair of facing electrodes, and
wherein said fixed resistance layer is disposed between said first electrode and said second electrode.

20. The nonvolatile memory element according to claim 19, wherein said fixed resistance layer is disposed (i) between said first electrode and said second electrode and (ii) adjacent to said variable resistance layer in a direction perpendicular to a direction from said first electrode to said second electrode.

* * * * *